(12) United States Patent
Baek et al.

(10) Patent No.: US 12,161,020 B2
(45) Date of Patent: Dec. 3, 2024

(54) ORGANIC LIGHT EMITTING DISPLAY DEVICE AND METHOD OF MANUFACTURING ORGANIC LIGHT EMITTING DISPLAY DEVICE

(71) Applicant: Samsung Display Co., Ltd., Yongin-Si (KR)

(72) Inventors: Young Seok Baek, Hwaseong-si (KR); Heena Kim, Hwaseong-si (KR); Sang Jin Park, Yongin-si (KR); Taehyeok Choi, Seoul (KR); Mijung Han, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 492 days.

(21) Appl. No.: 17/527,526

(22) Filed: Nov. 16, 2021

(65) Prior Publication Data

US 2022/0077247 A1 Mar. 10, 2022

Related U.S. Application Data

(62) Division of application No. 16/708,950, filed on Dec. 10, 2019, now Pat. No. 11,217,634.

(30) Foreign Application Priority Data

Dec. 28, 2018 (KR) .......................... 10-2018-0171985

(51) Int. Cl.
*H01L 27/32* (2006.01)
*H01L 51/52* (2006.01)
(Continued)

(52) U.S. Cl.
CPC ............ *H10K 59/00* (2023.02); *H10K 50/11* (2023.02); *H10K 50/8445* (2023.02);
(Continued)

(58) Field of Classification Search
CPC ............... H10K 50/11; H10K 50/8445; H10K 59/1201; H10K 59/124; H10K 59/50;
(Continued)

(56) References Cited

U.S. PATENT DOCUMENTS 9,632,487 B2   4/2017  Kim et al.
10,147,769 B2  12/2018 Lee et al.
(Continued)

FOREIGN PATENT DOCUMENTS

CN   106409867 A   2/2017
CN   107026245 A   8/2017
(Continued)

*Primary Examiner* — Victoria K. Hall
(74) *Attorney, Agent, or Firm* — CANTOR COLBURN LLP

(57) ABSTRACT

An organic light emitting display device includes a substrate, an insulation layer structure, a light emitting layer, and an optical module. The substrate has an opening region, a peripheral region surrounding the opening region, and a display region surrounding the peripheral region. An opening is defined through the substrate in the opening region. The insulation layer structure is disposed in the display region and the peripheral region on the substrate. The light emitting layer is disposed on the insulation layer structure, and extends in a first direction from the display region into the opening region. A first opening is defined through the light emitting layer in the peripheral region. The optical module is disposed in the opening of the substrate.

7 Claims, 23 Drawing Sheets

(51) Int. Cl.
- *H01L 51/56* (2006.01)
- *H10K 50/11* (2023.01)
- *H10K 50/844* (2023.01)
- *H10K 59/00* (2023.01)
- *H10K 59/12* (2023.01)
- *H10K 59/124* (2023.01)
- *H10K 59/80* (2023.01)
- *H10K 71/00* (2023.01)
- *H10K 59/50* (2023.01)
- *H10K 59/60* (2023.01)
- *H10K 59/65* (2023.01)
- *H10K 71/80* (2023.01)

(52) U.S. Cl.
CPC ....... *H10K 59/1201* (2023.02); *H10K 59/124* (2023.02); *H10K 59/8731* (2023.02); *H10K 71/00* (2023.02); *H10K 71/851* (2023.02); *H10K 50/844* (2023.02); *H10K 59/50* (2023.02); *H10K 59/60* (2023.02); *H10K 59/65* (2023.02); *H10K 71/80* (2023.02)

(58) Field of Classification Search
CPC .... H10K 59/60; H10K 59/65; H10K 59/8722; H10K 59/8731; H10K 71/00; H10K 71/851

See application file for complete search history.

(56) References Cited

U.S. PATENT DOCUMENTS

| | | |
|---|---|---|
| 10,651,265 B2 | 5/2020 | Park |
| 11,217,634 B2* | 1/2022 | Baek .................. H10K 59/8731 |
| 11,631,730 B2 | 4/2023 | Ka et al. |
| 2017/0031323 A1* | 2/2017 | Kim ..................... H10K 59/124 |
| 2017/0148856 A1 | 5/2017 | Choi et al. |
| 2017/0162637 A1 | 6/2017 | Choi et al. |
| 2017/0221982 A1* | 8/2017 | Park .................. H10K 59/8731 |
| 2017/0288004 A1 | 10/2017 | Kim et al. |
| 2018/0069063 A1* | 3/2018 | Kim ...................... G02F 1/1343 |
| 2018/0158878 A1* | 6/2018 | Lee ....................... H10K 71/10 |
| 2019/0051859 A1 | 2/2019 | Choi et al. |
| 2019/0081129 A1 | 3/2019 | Sung et al. |
| 2019/0245015 A1 | 8/2019 | Lee et al. |
| 2020/0083475 A1 | 3/2020 | Kang et al. |
| 2020/0106045 A1 | 4/2020 | Han et al. |
| 2020/0127231 A1 | 4/2020 | Yun et al. |
| 2020/0144535 A1 | 5/2020 | Kim |
| 2020/0144539 A1 | 5/2020 | Park et al. |
| 2020/0168683 A1 | 5/2020 | Son et al. |
| 2020/0176529 A1 | 6/2020 | Choi et al. |
| 2022/0029140 A1* | 1/2022 | Wu ....................... H10K 59/40 |

FOREIGN PATENT DOCUMENTS

| | | |
|---|---|---|
| CN | 108172597 A | 6/2018 |
| KR | 1020100037876 A | 4/2010 |
| KR | 1020170015633 A | 2/2017 |
| KR | 1020170117291 A | 10/2017 |

\* cited by examiner

FIG. 2
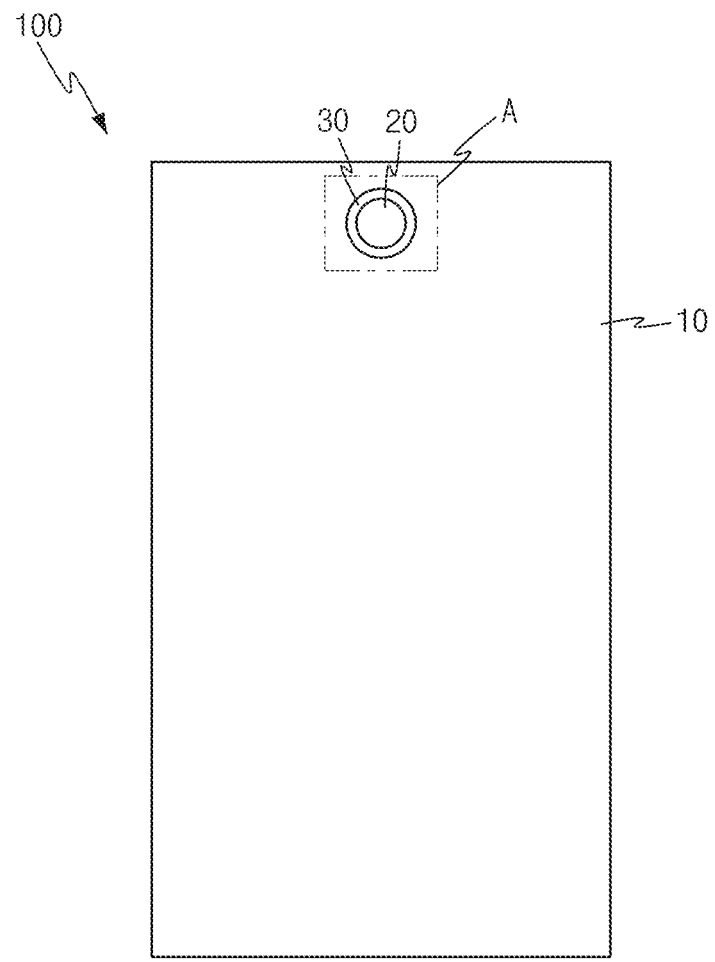
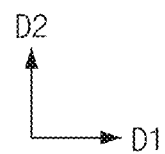

ORGANIC LIGHT EMITTING DISPLAY DEVICE AND METHOD OF MANUFACTURING ORGANIC LIGHT EMITTING DISPLAY DEVICE

This application is a divisional of U.S. patent application Ser. No. 16/708,950, filed on Dec. 10, 2019 now U.S. Pat. No. 11,217,634, issued Jan. 4, 2022, which claims priority to Korean Patent Application No. 10-2018-0171985, filed on Dec. 28, 2018, and all the benefits accruing therefrom under 35 U.S.C. § 119, the content of which in its entirety is herein incorporated by reference.

BACKGROUND

1. Field

Exemplary embodiments relate generally to an organic light emitting display device and a method of manufacturing an organic light emitting display device. More particularly, exemplary embodiments of the invention relate to an organic light emitting display device including optical modules disposed in a portion of a display region and a method of manufacturing the organic light emitting display device including optical modules disposed in the portion of the display region.

2. Description of the Related Art

A flat panel display ("FPD") device is widely used as a display device of an electronic device because the FPD device is lightweight and thin compared to a cathode-ray tube ("CRT") display device. Such a FPD device includes a liquid crystal display ("LCD") device and an organic light emitting display ("OLED") device.

The OLED device may have a display region in which an image is displayed and a non-display region in which gate drivers, data drivers, wires, optical modules (e.g., a camera module, a motion recognition sensor, etc.) are disposed.

SUMMARY

Recently, an organic light emitting display ("OLED") device where the optical module is disposed in an opening by forming the opening in a portion of the display region has been developed. In such an OLED display, block patterns blocking water, moisture, etc. capable of penetrating into the display region that is located adjacent to the optical module may be provided in an outer portion of a portion where the optical module is disposed. However, the blocking patterns may be easily damaged by external impacts or a stress in a manufacturing process. When the blocking patterns are damaged, a defect of a pixel included in the OLED device may occur.

An exemplary embodiment provide an OLED device including optical modules disposed in a portion of a display region.

An exemplary embodiment provide a method of manufacturing an OLED device including optical modules disposed in a portion of a display region.

According to an exemplary embodiment, an OLED device includes a substrate, an insulation layer structure, a light emitting layer, and an optical module. In such an embodiment, the substrate includes an opening region, a peripheral region surrounding the opening region, and a display region surrounding the peripheral region. In such an embodiment, an opening is defined through the substrate in the opening region. In such an embodiment, the insulation layer structure is disposed in the display region and the peripheral region on the substrate. In such an embodiment, the light emitting layer is disposed on the insulation layer structure, and extends in a first direction from the display region into the opening region. In such an embodiment, a first opening is defined through the light emitting layer in the peripheral region. In such an embodiment, the optical module is disposed in the opening.

In an exemplary embodiment, the insulation layer structure may include a first groove defined in the peripheral region.

In an exemplary embodiment, the light emitting layer may be disposed inside the first groove, and the first opening may be located inside the first groove.

In an exemplary embodiment, the insulation layer structure may include a gate insulation layer and an insulating interlayer. In such an embodiment, the gate insulation layer may be disposed on the substrate, and an opening may be defined through the gate insulation layer in the peripheral region. In such an embodiment, the insulating interlayer may be disposed on the gate insulation layer, and an opening may be defined through the insulating interlayer in the peripheral region to overlap the opening of the gate insulation layer.

In an exemplary embodiment, the insulation layer structure may further include a buffer layer interposed between the substrate and the gate insulation layer. In such an embodiment, the opening of the gate insulation layer and the opening of the insulating interlayer may define the first groove of the insulation layer structure.

In an exemplary embodiment, the OLED device may further include a first thin film encapsulation layer and a second thin film encapsulation layer. In such an embodiment, the first thin film encapsulation layer may be disposed on the light emitting layer, and may be disposed in the first opening and cover the light emitting layer in the peripheral region. In such an embodiment, the second thin film encapsulation layer may be disposed on the first thin film encapsulation layer, and may cover the first thin film encapsulation layer in the peripheral region. In such an embodiment, the first thin film encapsulation layer may be in direct contact with the buffer layer through the first opening.

In an exemplary embodiment, the OLED device may further include an upper electrode disposed on the light emitting layer.

In an exemplary embodiment, a second opening may be defined through the upper electrode in the peripheral region to overlap the first opening.

In an exemplary embodiment, the OLED device may further include a capping layer disposed to overlap the upper electrode. In such an embodiment, a third opening may be defined through the capping layer in the peripheral region to overlap the first and second openings.

In an exemplary embodiment, the OLED device may further include a capping layer disposed on the upper electrode. In such an embodiment, the capping layer may cover lateral surfaces of the light emitting layer by which the first opening is defined and lateral surfaces of the upper electrode by which the second opening is defined, and a third opening may be defined through the capping layer to be inside the first and second openings.

In an exemplary embodiment, the upper electrode may be disposed in the first opening, and may cover the light emitting layer in the peripheral region.

In an exemplary embodiment, the substrate may further include a second groove surrounding the first groove. In such an embodiment, the second groove may be defined in the peripheral region.

In an exemplary embodiment, another opening formed may be defined through the light emitting layer in the second groove.

According to an exemplary embodiment, a method of manufacturing an OLED device includes: preparing a substrate including an opening region, a peripheral region surrounding the opening region, and a display region surrounding the peripheral region; providing an insulation layer structure in the display region and the peripheral region on the substrate; forming a groove by removing at least a portion of the insulation layer structure located in the peripheral region; providing a light emitting layer inside the groove; contacting a first patterning member to a portion of the light emitting layer in the groove; forming a first opening of the light emitting layer by removing a portion of the light emitting layer formed in the groove after the first patterning member is disposed apart from the light emitting layer; providing a first thin film encapsulation layer in a way such that the first thin film encapsulation layer overlaps the first opening of the light emitting layer; and forming an opening in the opening region of the substrate.

In an exemplary embodiment, the method may further include providing an upper electrode on the light emitting layer and forming a second opening in the upper electrode in a way such that the second opening overlaps the first opening of the light emitting layer, after the forming the first opening of the light emitting layer.

In an exemplary embodiment, the method may further include providing a capping layer on the upper electrode, contacting a second patterning member having a width less than a width of the first patterning member to a portion of the capping layer where the first and second openings are formed, and forming a third opening of the capping layer by removing a portion of the capping layer formed in the first and second openings after the second patterning member is disposed apart from the capping layer, after the forming the second opening in the upper electrode.

In an exemplary embodiment, the capping layer may cover lateral surfaces of the light emitting layer by which the first opening is defined and lateral surfaces of the upper electrode by which the second opening is defined, and the thin film encapsulation layer may be disposed in the third opening of the capping layer.

In an exemplary embodiment, a width of the third opening may be less than a width of each of the first and second openings.

In an exemplary embodiment, the method may further include providing an optical module in the opening, after the forming the opening in the opening region.

In an exemplary embodiment, the insulation layer structure may include a buffer layer on the substrate, a gate insulation layer on the buffer layer, where an opening may be defined through the gate insulation layer in the peripheral region, and an insulating interlayer on the gate insulation layer, where an opening may be defined through the insulating interlayer in the peripheral region to overlap the opening of the gate insulation layer.

Exemplary embodiments of the OLED device include the light emitting layer with the first opening, the upper electrode with the second opening, and the capping layer with the third opening inside the groove, such that the light emitting layer, the upper electrode and the capping layer may be disconnected or shorted in the groove by the first, second, and third openings. In such embodiments, the light emitting layer, the upper electrode, and the capping layer may be separated without the opening having an enlarged lower portion or an under-cut shape. In such embodiments, since the opening having an enlarged lower portion is not formed, a residue of a photoresist used for patterning a metal layer may be readily removed in the groove. That is, thin film encapsulation layers may be readily disposed inside the groove of the peripheral region. Accordingly, the OLED device may readily block that water, moisture, etc. that permeates into the semiconductor element and the light emitting structure.

In a method of manufacturing the OLED device in accordance with an exemplary embodiment, the light emitting layer with the first opening, the upper electrode with the second opening, and the capping layer with the third opening may be formed by using the first patterning member and the second patterning member. Accordingly, the light emitting layer, the upper electrode, and the capping layer may be disconnected or shorted inside the groove by the first, second, and third openings without an opening having an enlarged lower portion or an under-cut shape, and the OLED device may readily block water, moisture, etc. that permeates into the semiconductor element and the light emitting structure.

BRIEF DESCRIPTION OF THE DRAWINGS

An exemplary embodiment can be understood in more detail from the following description taken in conjunction with the accompanying drawings, in which:

FIG. 2 is a plan view illustrating the OLED device of FIG. 1;

DETAILED DESCRIPTION

Figure 1:
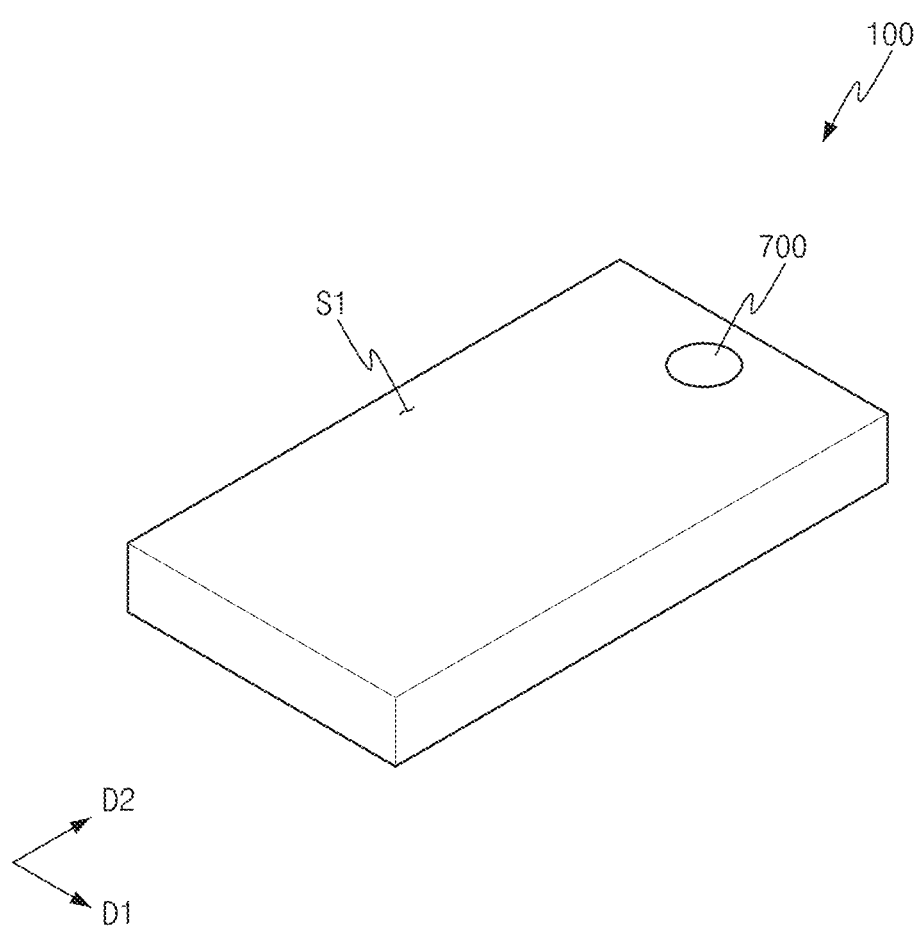
FIG. 1 is a perspective view illustrating an organic light emitting display ("OLED") device in accordance with an exemplary embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of the invention will be explained in detail with reference to the accompanying drawings.

Figure 3:
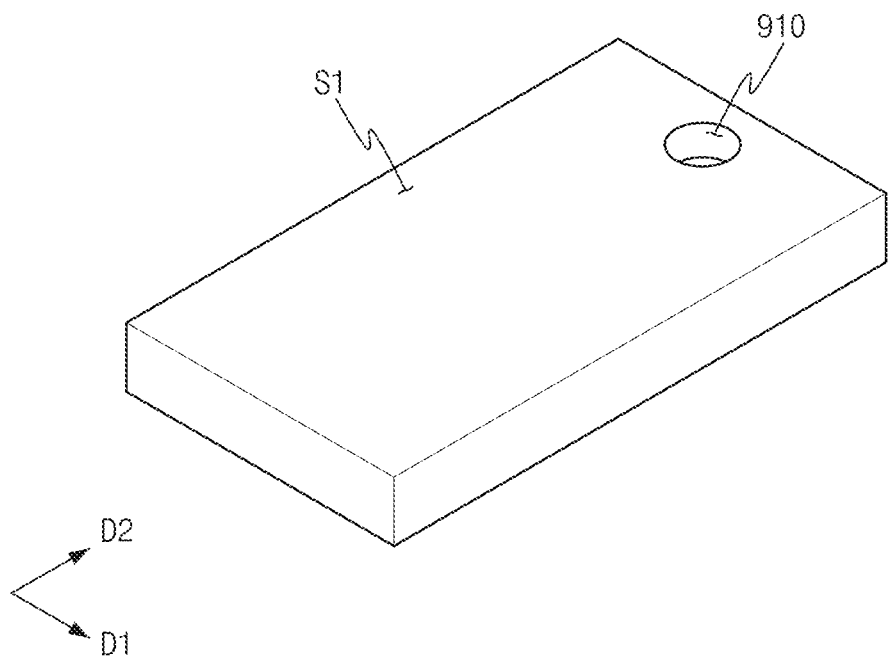
FIGS. 3 and 4 are perspective views showing an opening defined in the OLED device of FIG. 1.
Figure 4:
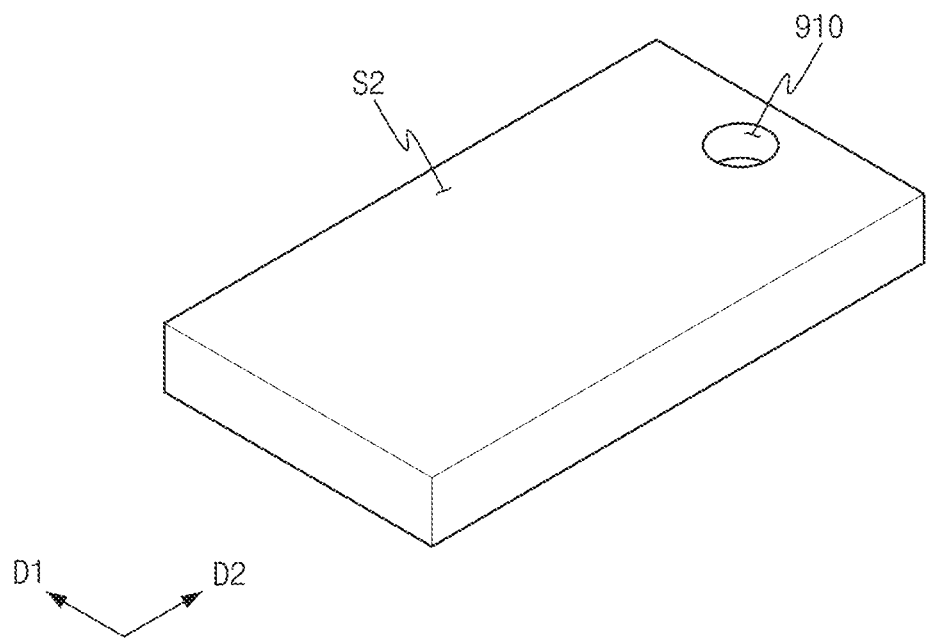

FIG. 1 is a perspective view illustrating an organic light emitting display ("OLED") device in accordance with an exemplary embodiment, and FIG. 2 is a plan view illustrating the OLED device of FIG. 1. FIGS. 3 and 4 are perspective views for describing an opening defined in the OLED device of FIG. 1.

Referring to FIGS. 1, 2, 3, and 4, an exemplary embodiment of an OLED device 100 may include an optical module 700, etc. The OLED device 100 may have a first surface S1 and a second surface S2. In such an embodiment, an image may be displayed in the first surface S1, and the second surface S2 may be opposite to the first surface S1. The optical module 700 may be disposed in a side of the OLED device 100.

In an exemplary embodiment, as illustrated in FIG. 2, the OLED device 100 may have a display region 10, an opening region 20 and a peripheral region 30. Here, the peripheral region 30 may substantially surround the opening region 20, and the display region 10 may substantially surround the peripheral region 30. Alternatively, the display region 10 may not completely surround but partially surround the peripheral region 30. In an exemplary embodiment, as illustrated in FIGS. 3 and 4, an opening 910 is defined in the OLED device 100 and disposed in the opening region 20. In an exemplary embodiment, the OLED device 100 may further include a bending region and a pad region located in a side of the OLED device 100. In one exemplary embodiment, for example, the bending region may be bent with respect to an axis in a first direction D1 or a second direction D2 that are parallel to an upper surface of the OLED device 100, and the pad region may be located on a lower surface of the OLED device 100.

Referring to FIGS. 1, 2, 3 and 4, the display region 10 may include a plurality of sub-pixel regions (not shown). The sub-pixel regions may be arranged in the display region 10 substantially in a matrix form. A sub-pixel circuit (e.g., a semiconductor element 250 of FIG. 6) may be disposed in each of the sub-pixel regions of the display region 10, and an OLED (e.g., a light emitting structure 200 of FIG. 6) may be disposed on the sub-pixel circuit. An image may be displayed in the display region 10 through the sub-pixel circuit and the OLED.

In one exemplary embodiment, for example, first, second and third sub-pixel circuits may be disposed in the sub-pixel regions, and first, second and third OLEDs may be disposed on the first, second and third sub-pixel circuits, respectively.

The first sub-pixel circuit may be coupled to (or connected to) a first OLED capable of emitting a red color of light, and the second sub-pixel circuit may be coupled to a second OLED capable of emitting a green color of light. The third sub-pixel circuit may be coupled to the third sub-pixel structure capable of emitting a blue color of light.

In an exemplary embodiment, the first OLED may be disposed to overlap the first sub-pixel circuit, and the second OLED may be disposed to overlap the second sub-pixel circuit. The third OLED may be disposed to overlap the third sub-pixel circuit. Alternatively, the first OLED may be disposed to overlap a portion of the first sub-pixel circuit and a portion of a sub-pixel circuit that is different from the first sub-pixel circuit, and the second OLED may be disposed to overlap a portion of the second sub-pixel circuit and a portion of a sub-pixel circuit region that is different from the second sub-pixel circuit. The third OLED may be disposed to overlap a portion of the third sub-pixel circuit and a portion of a sub-pixel circuit that is different from the third sub-pixel circuit.

In such an embodiment, the first, second and third OLEDs may be arranged based on a RGB stripe method where square of a same size are sequentially arranged, a s-stripe method including a blue OLED having a relatively large area, a WRGB method further including a white OLED, a pen-tile method repeatedly arranged in an RG-GB pattern, etc.

In such an embodiment, at least one driving transistor, at least one switching transistor, and at least one capacitor may be disposed in the sub-pixel regions each.

In an exemplary embodiment, a shape of the display region 10 has a plan shape of a square, but not being limited thereto. In one exemplary embodiment, for example, the shape of the display region 10 may have a plan shape of a triangle, a plan shape of a diamond, a plan shape of a polygon, a plan shape of a circle, a plan shape of an track, a plan shape of an elliptic, etc.

The optical module 700 may be disposed in the opening 910. In one exemplary embodiment, for example, the optical module 700 may include at least one selected from a camera module for capturing (or recognizing) an image of an object, a face recognition sensor module for sensing a face of a user, a pupil recognition sensor module for sensing a pupil of a user, acceleration and geomagnetic sensor modules for determining movement of the OLED device 100, proximity and infrared sensor modules for detecting proximity to the OLED device 100, and a light intensity sensor module for measuring the degree of brightness when left in a pocket or a bag, etc. In an exemplary embodiment, a functional module such as a vibration module for indicating an incoming alarm, a speaker module for outputting sound, etc. may be disposed in the opening 910.

In an exemplary embodiment, a shape of the opening region 20 and the peripheral region 30 each has a plan shape of a circle, but not being limited thereto. In one exemplary embodiment, for example, the shape of the opening region 20 and the peripheral region 30 each may have a plan shape of a triangle, a plan shape of a diamond, a plan shape of a polygon, a plan shape of a tetragon, a plan shape of an track, a plan shape of an ellipse, etc.

Figure 5:
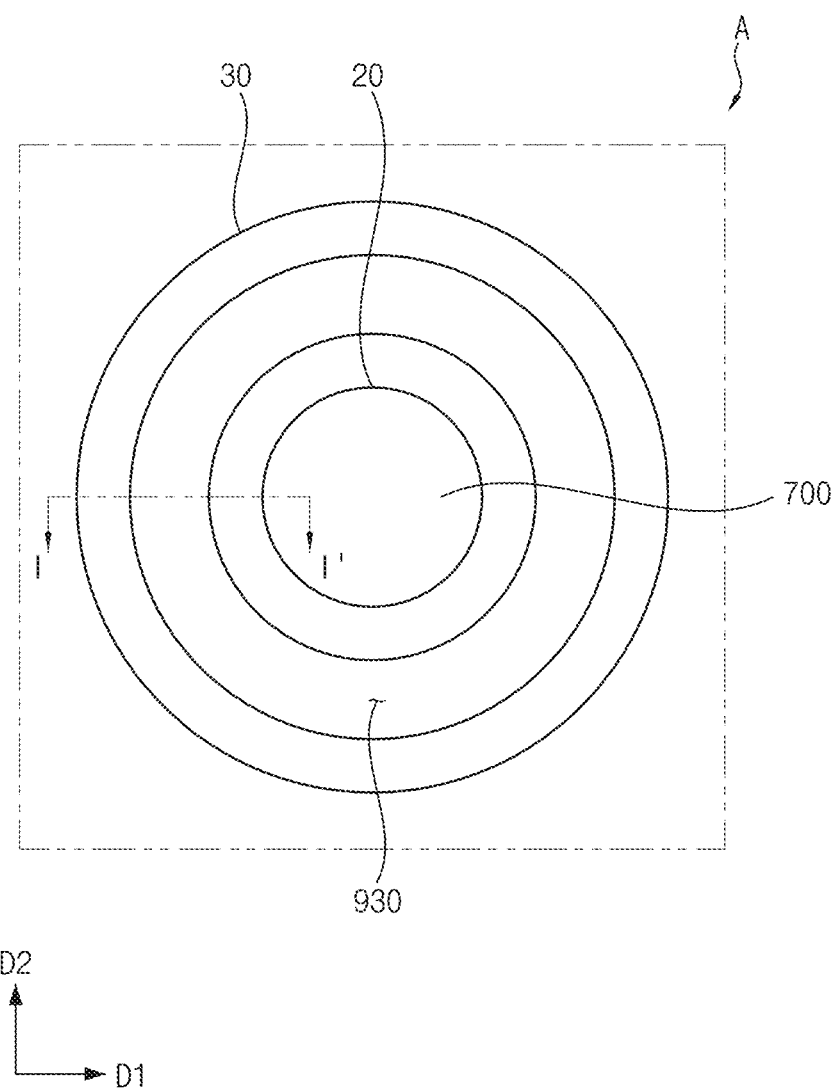
FIG. 5 is a partially enlarged plan view corresponding to region 'A' of FIG. 2.
Figure 6:
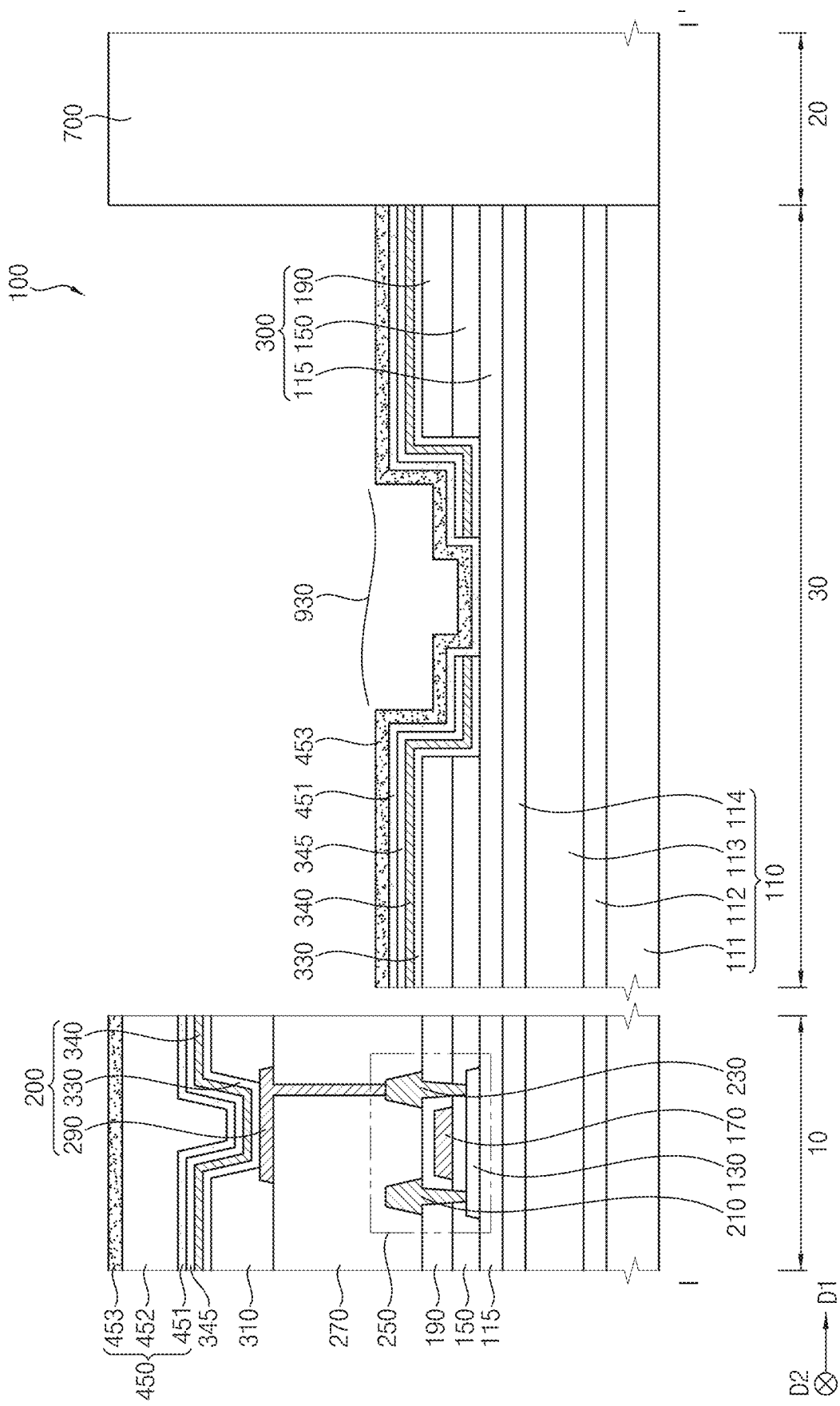
FIG. 6 is a cross-sectional view taken along line I-I' of FIG. 5.

FIG. 5 is a partially enlarged plan view corresponding to region 'A' of FIG. 2, and FIG. 6 is a cross-sectional view taken along line I-I' of FIG. 5.

Referring to FIGS. 5 and 6, an exemplary embodiment of an OLED device 100 may include a substrate 110, an insulation layer structure 300, a semiconductor element 250, a planarization layer 270, a light emitting structure 200, a pixel defining layer 310, a capping layer 345, a thin film encapsulation ("TFE") structure 450, an optical module 700, etc. In such an embodiment, the substrate 110 may include a first organic layer 111, a first barrier layer 112, a second organic layer 113, and a second barrier layer 114. In such an embodiment where the OLED device 100 has the display region 10, the opening region 20 and the peripheral region 30, the substrate 110 may be divided into the display region 10, the opening region 20 and the peripheral region 30. The insulation layer structure 300 may include a buffer layer 115, a gate insulation layer 150 and insulating interlayer 190, and the semiconductor element 250 may include an active layer 130, a gate electrode 170, a source electrode 210 and a drain electrode 230. In such an embodiment, the light emitting structure 200 may include a lower electrode 290, a light emitting layer 330 and an upper electrode 340, and the TFE structure 450 may include a first TFE layer 451, a second TFE layer 452 and a third TFE layer 453.

In an exemplary embodiment, the insulation layer structure 300 may further include a groove 930 defined in the peripheral region 30 and the light emitting layer 330, the upper electrode 340 and the capping layer 345 may be spaced apart from each other inside (or within) the groove 930. In such an embodiment, an opening may be defined through the light emitting layer 330, the upper electrode 340 and the capping layer 345 inside the groove 930. Accordingly, the OLED device 100 includes the light emitting layer 330, the upper electrode 340 and the capping layer 345, through which the opening is defined inside the groove 930, and the OLED device 100 may block that water, moisture, etc. that permeates into the semiconductor element 250 and the light emitting structure 200.

The first organic layer 111 may define the lowermost part of the OLED device 100. The first organic layer 111 may include an organic material having flexibility. In one exemplary embodiment, for example, the first organic layer 111 may include a random copolymer or a block copolymer. In an exemplary embodiment, the first organic layer 111 may have a high transparency, a low coefficient of thermal expansion, and a high glass transition temperature. In an exemplary embodiment, the first organic layer 111 includes an imide radical, such that a heat resistance, a chemical resistance, a wear resistance and an electrical characteristics may be improved. In an exemplary embodiment, the first organic layer 111 may include polyimide.

The first barrier layer 112 may be disposed on the entire first organic layer 111. The first barrier layer 112 may block moisture or water that permeates through the first organic layer 111. The first barrier layer 112 may include inorganic materials having flexibility. In an exemplary embodiment, the first barrier layer 112 may include silicon oxide or silicon nitride, for example. In one exemplary embodiment, for example, the first barrier layer 112 may include at least one selected from silicon oxide (SiO), silicon nitride (SiN), silicon oxynitride (SiON), silicon oxycarbide (SiOC), silicon carbon nitride (SiCN), aluminum oxide (AlO), aluminum nitride (AlN), tantalum oxide (TaO), hafnium oxide (HfO), zirconium oxide (ZrO) and titanium oxide (TiO), for example.

The second organic layer 113 may be disposed on the entire first barrier layer 112. The second organic layer 113 may include an organic material having flexibility. In one exemplary embodiment, for example, second organic layer 113 may include a random copolymer or a block copolymer. In an exemplary embodiment, the second organic layer 113 may include polyimide.

The second barrier layer 114 may be disposed on the entire second organic layer 113. The second barrier layer 114 may block moisture or water that may permeate through the second organic layer 113. The second barrier layer 114 may include an inorganic material having flexibility. In an exemplary embodiment, the second barrier layer 114 may include SiO or SiN, for example.

In such an embodiment, as described above, the substrate 110 may include the first organic layer 111, the first barrier layer 112, the second organic layer 113 and the second barrier layer 114.

In an exemplary embodiment, the substrate 110 includes four layers, but not being limited thereto. In one alternative exemplary embodiment, for example, the substrate 110 may include a single layer or at least two layers, e.g., two or three layers.

In an exemplary embodiment, the OLED device 100 may include a transparent material or an opaque material. In one exemplary embodiment, for example, the substrate 110 may include at least one selected from a quartz substrate, a synthetic quartz substrate, a calcium fluoride substrate, an F-doped quartz substrate, a soda-lime glass substrate and a non-alkali glass substrate, for example.

The buffer layer 115 may be disposed on the substrate 110 (e.g., the second barrier layer 114). In one exemplary embodiment, for example, the buffer layer 115 may be disposed on the entire substrate 110. The buffer layer 115 may effectively prevent the diffusion of metal atoms and/or impurities from the substrate 110 into the semiconductor element 250 and the light emitting structure 200. In such an embodiment, the buffer layer 115 may control a rate of a heat transfer in a crystallization process for forming an active layer, thereby obtaining substantially uniform active layer. In such an embodiment, the buffer layer 115 may improve a surface flatness of the substrate 110 when a surface of the substrate 110 is relatively irregular. According to a type of the substrate 110, at least two buffer layers 115 may be provided on the substrate 110, or the buffer layer 115 may be omitted. In one exemplary embodiment, for example, the buffer layer 115 may include an organic material or an inorganic material.

The active layer 130 may be disposed in the display region 10 on the buffer layer 115. The active layer 130 may include at least one selected from a metal oxide semiconductor, an inorganic semiconductor (e.g., amorphous silicon, polysilicon, etc.) and an organic semiconductor, for example. The active layer 130 may include a source region and a drain region.

The gate insulation layer 150 may be disposed on the active layer 130. The gate insulation layer 150 may cover the active layer 130 in the display region 10 on the buffer layer 115, and may extend in a first direction D1 from the display region 10 into the opening region 20 on the buffer layer 115. In an exemplary embodiment, the gate insulation layer 150 may include an opening that exposes a portion of an upper surface of the buffer layer 115 in the peripheral region 30. The gate insulation layer 150 may sufficiently cover the active layer 130 on the buffer layer 115, and may have a substantially flat upper surface without a step around the active layer 130. Alternatively, the gate insulation layer 150 may cover the active layer 130 on the buffer layer 115, and may be disposed with a substantially uniform thickness along a profile of the active layer 130. The gate insulation layer 150 may include a silicon compound or a metal oxide, for example. In an exemplary embodiment, the gate insulation layer 150 may have a multi-layered structure including a plurality of insulation layers. In one exemplary embodiment, for example, the insulation layers may have different thicknesses from each other or include different materials from each other.

The gate electrode 170 may be disposed in the display region 10 on the gate insulation layer 150. The gate electrode 170 may be disposed on a portion of the gate insulation layer 150 under which the active layer 130 is located. The gate electrode 170 may include at least one selected from a metal, a metal alloy, a metal nitride, a conductive metal oxide and a transparent conductive material, for example. These materials may be used alone or in a suitable combination thereof. Alternatively, the gate electrode 170 may have a multi-layered structure including a plurality of layers.

The insulating interlayer 190 may be disposed on the gate electrode 170. The insulating interlayer 190 may cover the gate electrode 170 in the display region 10 on the gate insulation layer 150, and may extend in the first direction D1 on the gate insulation layer 150. In an exemplary embodiment, the insulating interlayer 190 may include an opening that exposes the portion of an upper surface of the buffer layer 115 in the peripheral region 30. In such an embodiment, the opening of the insulating interlayer 190 may overlap the opening of the gate insulation layer 150, and the openings may be defined as the groove 930 of the insulation layer structure 300. The insulating interlayer 190 may sufficiently cover the gate electrode 170 on the gate insulation layer 150, and may have a substantially flat upper surface without a step around the first gate electrode 170. Alternatively, the insulating interlayer 190 may cover the gate electrode 170 on the gate insulation layer 150, and may be disposed with a substantially uniform thickness along a profile of the gate electrode 170. The insulating interlayer 190 may include silicon compound or metal oxide, etc. Alternatively, the insulating interlayer 190 may have a multi-layered structure including a plurality of insulation layers. The insulation layers may have different thicknesses to each other or include different materials to each other.

Accordingly, the insulation layer structure 300 including the buffer layer 115, the gate insulation layer 150 and the insulating interlayer 190 may be disposed as described above.

The source electrode 210 and the drain electrode 230 may be disposed in the display region 10 on the insulating interlayer 190. The source electrode 210 may be connected to the source region of the active layer 130 via a contact hole formed by removing a first portion of the gate insulation layer 150 and the insulating interlayer 190. The drain electrode 230 may be connected to the drain region of the active layer 130 via a contact hole formed by removing a second portion of the gate insulation layer 150 and the insulating interlayer 190. Each of the source electrode 210 and the drain electrode 230 may include at least one selected from a metal, an alloy, metal nitride, conductive metal oxide, transparent conductive materials, etc. These may be used alone or in a suitable combination thereof. In an exemplary embodiment, each of the source and drain electrodes 210 and 230 may have a multi-layered structure including a plurality of layers.

Accordingly, the semiconductor element 250 including the active layer 130, the gate electrode 170, the source electrode 210 and the drain electrode 230 may be disposed as described above.

In an exemplary embodiment, the semiconductor element 250 has a top gate structure, but not being limited thereto. In one alternative exemplary embodiment, for example, the semiconductor element 250 may have a bottom gate structure.

In an exemplary embodiment, the OLED device 100 includes a single semiconductor element, but not being limited thereto. In one alternative exemplary embodiment, for example, the OLED device 100 may include at least one semiconductor element and at least one capacitor.

In an exemplary embodiment, the semiconductor element 250 includes the active layer 130, the gate electrode 170, the source electrode 210 and the drain electrode 230, but not being limited thereto. In one exemplary embodiment, for example, the semiconductor element 250 may have a configuration including the active layer 130, the gate insulation layer 150, the gate electrode 170, the insulating interlayer 190, the source electrode 210 and the drain electrode 230.

The planarization layer 270 may be disposed in the display region 10 on the insulating interlayer 190, the source electrode 210 and the drain electrode 230. The planarization layer 270 may cover the source and drain electrodes 210 and 230 in the display region 10 on the insulating interlayer 190, and may not be disposed in the peripheral region 30. In such an embodiment, the planarization layer 270 may be disposed only in the display region 10 on the insulating interlayer 190. Alternatively, the planarization layer 270 may be disposed in the peripheral region 30 on a portion of the insulation layer structure 300 located adjacent to a boundary of the display region 10 and the peripheral region 30, and may not be disposed in the peripheral region 30 on another portion of the insulation layer structure 300 located adjacent to a boundary of the peripheral region 30 and the opening region 20.

The planarization layer 270 may be disposed with a sufficiently great thickness in the display region 10, e.g., with a sufficiently great thickness to allow the planarization layer 270 to have a substantially flat upper surface. In such an embodiment, the planarization layer 270 may have a substantially flat upper surface, and a planarization process may be further performed on the planarization layer 270 to implement the flat upper surface of the planarization layer 270. Alternatively, the planarization layer 270 may be disposed with a substantially uniform thickness along a profile of the source and drain electrodes 210 and 230 in the display region 10 on the insulating interlayer 190. The planarization layer 270 may include organic materials or inorganic materials. In an exemplary embodiment, the planarization layer 270 may include organic materials. In one exemplary embodiment, for example, the planarization layer 270 may include at least one selected from a photoresist, a polyacryl-based resin, a polyimide-based resin, a polyamide-based resin, a siloxane-based resin, an acryl-based resin and an epoxy-based resin, for example.

The lower electrode 290 may be disposed in the display region 10 on the planarization layer 270. The lower electrode 290 may be connected to the drain electrode 230 via a contact hole defined through the planarization layer 270, e.g., formed by removing a portion of the planarization layer 270. In such an embodiment, the lower electrode 290 may be electrically connected to the semiconductor element 250. The lower electrode 290 may include at least one selected from a metal, a metal alloy, a metal nitride, a conductive metal oxide and a transparent conductive material, for example. These materials may be used alone or in a suitable combination thereof. In an exemplary embodiment, the lower electrode 290 may have a multi-layered structure including a plurality of layers.

The pixel defining layer 310 may be disposed in the display region 10 on the planarization layer 270, and may not be disposed in the peripheral region 30. In such an embodiment, the pixel defining layer 310 may be disposed only in the display region 10. Alternatively, the pixel defining layer 310 may be disposed in the peripheral region 30 on a portion of the insulation layer structure 300 located adjacent to a boundary of the display region 10 and the peripheral region 30, and may not be disposed in the peripheral region 30 on another portion of the insulation layer structure 300 located adjacent to a boundary of the peripheral region 30 and the opening region 20.

The pixel defining layer 310 may cover lateral portions of the lower electrode 290, and may expose a portion of an upper surface of the lower electrode 290. The pixel defining layer 310 may include an organic material or an inorganic material. In an exemplary embodiment, the pixel defining layer 310 may include an organic material.

In the display region 10, the light emitting layer 330 may be disposed on the pixel defining layer 310 and the lower electrode 290. The light emitting layer 330 may extend in the first direction D1, and may be disposed in the peripheral region 30 on the insulating interlayer 190. In an exemplary embodiment, the light emitting layer 330 may be disposed inside the groove 930, and a first opening (e.g., a first opening 931 of FIG. 12) that exposes the portion of an upper surface of the buffer layer 115 located in the peripheral region 30 may be defined through a portion of the light emitting layer 330 in the peripheral region 30. In such an embodiment, the first opening of the light emitting layer 330 may be disposed or located inside of the groove 930. In such an embodiment, the light emitting layer 330 may be separated (e.g., shorted, cut or broken) in the peripheral region 30 by the first opening.

If the light emitting layer 330 does not include the first opening in the peripheral region 30, the light emitting layer 330 may become a permeability path for water and/or moisture. That is, a portion (e.g., side end portion) of the light emitting layer 330 may be exposed in the opening region 20, and the water and/or moisture may permeate through the exposed portion of the light emitting layer 330. In this case, the semiconductor element 250 and the light emitting structure 200 disposed in the display region 10 that is located adjacent to the peripheral region 30 may be damaged by the water and/or moisture. In an exemplary embodiment, the first opening is defined through the light emitting layer 330 in the peripheral region 30, such that the light emitting layer 330 may be separated or disconnected inside the groove 930. In such an embodiment, as the light emitting layer 330 is separated inside the groove 930, the permeability path of the light emitting layer 330 may be blocked. Accordingly, although the light emitting layer 330 is disposed in the peripheral region 30, a defect of a pixel included in the OLED device 100 that may occur by the water and/or moisture permeated through the exposed portion of the light emitting layer 330 may be effectively prevented.

The light emitting layer 330 may have a multi-layered structure including an organic light emission layer ("EML"), a hole injection layer ("HIL"), a hole transport layer ("HTL"), an electron transport layer ("ETL"), an electron injection layer ("EIL"), etc. In an exemplary embodiment, the EML, the HIL, the HTL, the ETL and the EIL may be disposed in the peripheral region 30. In an exemplary embodiment, the HIL, the HTL, the ETL and the EIL may be disposed in the peripheral region 30 except for the EML.

The EML of the light emitting layer 330 may be formed using at least one of light emitting materials capable of generating different colors of light (e.g., a red color of light, a blue color of light, and a green color of light, etc.) according to sub-pixels. Alternatively, the EML of the light emitting layer 330 may generally generate a white color of light by stacking a plurality of light emitting materials capable of generating different colors of light such as a red color of light, a green color of light, a blue color of light, etc. In such an embodiment, a color filter may be formed on the light emitting layer 330 that is located on the lower electrode 290. The color filter may include at least one selected from a red color filter, a green color filter and a blue color filter. Alternatively, the color filter may include at least one selected from a yellow color filter, a cyan color filter and a magenta color filter. The color filter may include a photosensitive resin or a color photoresist, for example.

In the display region 10, the upper electrode 340 may be disposed to overlap the light emitting layer 330. The upper electrode 340 may extend in the first direction D1 on the light emitting layer 330, and may be disposed in the peripheral region 30. In an exemplary embodiment, the upper electrode 340 may be disposed inside the groove 930, and a second opening (e.g., a second opening 932 of FIG. 14) that exposes the portion of an upper surface of the buffer layer 115 located in the peripheral region 30 may be defined through a portion of the upper electrode 340 in the peripheral region 30. In such an embodiment, the second opening of the upper electrode 340 may be located inside of the groove 930. In such an embodiment, the second opening of the upper electrode 340 may overlap the first opening of the light emitting layer 330. In such an embodiment, the upper electrode 340 may be separated in the peripheral region 30 by the second opening.

If the upper electrode 340 does not include the second opening in the peripheral region 30, the upper electrode 340 may become a permeability path for water and/or moisture. That is, a portion (e.g., side end portion) of the upper electrode 340 may be exposed in the opening region 20, and the water and/or moisture may permeate through the exposed portion of the upper electrode 340. In this case, the semiconductor element 250 and the light emitting structure 200 disposed in the display region 10 that is located adjacent to the peripheral region 30 may be damaged by the water and/or moisture. In an exemplary embodiment, the second opening is defined through the upper electrode 340 in the peripheral region 30, such that the upper electrode 340 may be separated or disconnected inside the groove 930. In such an embodiment, as the upper electrode 340 is separated inside the groove 930, the permeability path of the upper electrode 340 may be blocked. Accordingly, although the upper electrode 340 is disposed in the peripheral region 30, a defect of a pixel included in the OLED device 100 that may occur by the water and/or moisture permeated through the exposed portion of upper electrode 340 may be effectively prevented.

The upper electrode 340 may include at least one selected from a metal, a metal alloy, a metal nitride, a conductive metal oxide and a transparent conductive material, for example. In one exemplary embodiment, for example, the upper electrode 340 may include at least one selected from gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an alloy of aluminum, aluminum nitride (AlN), an alloy of silver, tungsten nitride (WN), an alloy of copper, an alloy of molybdenum, titanium nitride (TiN), chromium nitride (CrN), tantalum nitride (TaN), strontium ruthenium oxide (SRO), zinc oxide (ZnO), indium tin oxide ("ITO"), stannum oxide (SnO), indium oxide (InO), gallium oxide (GaO) and indium zinc oxide ("IZO"), for example. These materials may be used alone or in a suitable combination thereof. In an exemplary embodiment, the upper electrode 340 may have a multi-layered structure including a plurality of layers.

Accordingly, the light emitting structure 200 including the lower electrode 290, the light emitting layer 330 and the upper electrode 340 may be disposed on the planarization layer 270.

In the display region 10, the capping layer 345 may be disposed to overlap the upper electrode 340. The capping layer 345 may extend in the first direction D1 on the upper electrode 340, and may be disposed in the peripheral region 30. In an exemplary embodiment, the capping layer 345 may be disposed inside the groove 930, and a third opening (e.g., a third opening 933 of FIG. 17) that exposes the portion of an upper surface of the buffer layer 115 located in the peripheral region 30 may be defined through a portion of the capping layer 345 in the peripheral region 30. In such an embodiment, the third opening of the capping layer 345 may be located inside of the groove 930. In such an embodiment, the third opening of the capping layer 345 may overlap the first opening of the light emitting layer 330 and the second opening of the upper electrode 340. In such an embodiment, the capping layer 345 may be separated or disconnected in the peripheral region 30 by the third opening.

If the capping layer 345 does not include the third opening in the peripheral region 30, the capping layer 345 may be used as a permeability path for water and/or moisture. That is, a portion (e.g., side end portion) of the capping layer 345 may be exposed in the opening region 20, and the water and/or moisture may permeate through the exposed portion of the capping layer 345. In this case, the semiconductor element 250 and the light emitting structure 200 disposed in the display region 10 that is located adjacent to the peripheral region 30 may be damaged by the water and/or moisture. In an exemplary embodiment, the third opening is defined through the capping layer 345 in the peripheral region 30, such that the capping layer 345 may be separated inside the groove 930. In such an embodiment, as the capping layer 345 is separated inside the groove 930, the permeability path of the capping layer 345 may be blocked. Accordingly, although the capping layer 345 is disposed in the peripheral region 30, a defect of a pixel included in the OLED device 100 that may occur by the water and/or moisture permeated through the exposed portion of the capping layer 345 may be effectively prevented.

The capping layer 345 may protect the light emitting structure 200, and may include an organic materials or an inorganic material. In an exemplary embodiment, the capping layer 345 may include an organic material such as a triamine derivative, arylenediamine derivative, 4,4'-N,N'-dicarbazole-biphenyl ("CBP"), tris(8-hydroxyquinolate)aluminium ("Alq3"), etc.

The first TFE layer 451 may be disposed in the display region 10 and the peripheral region 30 on the capping layer 345. The first TFE layer 451 may cover the capping layer 345 in the display region 10, and may be disposed with a substantially uniform thickness along a profile of the capping layer 345 and extend in the peripheral region 30. The first TFE layer 451 may be disposed along a profile of the capping layer 345 in the peripheral region 30. In an exemplary embodiment, the first TFE layer 451 may be in direct contact with the portion of an upper surface of the buffer layer 115 through the first, second and third openings. The first TFE layer 451 may effectively prevent the light emitting structure 200 from being deteriorated by the permeation of moisture, water, oxygen, etc. In such an embodiment, the first TFE layer 451 may protect the light emitting structure 200 from external impacts. The first TFE layer 451 may include an inorganic material having flexibility.

The second TFE layer 452 may be disposed in the display region 10 on the first TFE layer 451, and may not be disposed in the peripheral region 30. In such an embodiment, the second TFE layer 452 may be disposed only in the display region 10. Alternatively, the second TFE layer 452 may be disposed in the peripheral region 30 on a portion of the insulation layer structure 300 located adjacent to a boundary of the display region 10 and the peripheral region 30, and may not be disposed in the peripheral region 30 on another portion of the insulation layer structure 300 located adjacent to a boundary of the peripheral region 30 and the opening region 20.

The second TFE layer 452 may improve the flatness of the OLED device 100, and may protect the light emitting structure 200. The second TFE layer 452 may include an organic material having the flexibility.

The third TFE layer 453 may be disposed in the display region 10 on the second TFE layer 452 and in the peripheral region 30 on the first TFE layer 451. The third TFE layer 453 may cover the second TFE layer 452 in the display region 10 and be disposed with a substantially uniform thickness along a profile of the second TFE layer 452, and may extend in the peripheral region 30. The third TFE layer 453 may cover the first TFE layer 451 in the peripheral region 30, and may be disposed with a substantially uniform thickness along a profile of the first TFE layer 451. The third TFE layer 453, together with the first TFE layer 451, may effectively prevent the light emitting structure 200 from being deteriorated by the permeation of moisture, water, oxygen, etc. In such an embodiment, the third TFE layer 453, together with the first and second TFE layers 451 and 452, may effectively protect the light emitting structure 200 from external impacts. The third TFE layer 453 may include an inorganic material having the flexibility.

In an exemplary embodiment, the TFE structure 450 including the first TFE layer 451, the second TFE layer 452, and the third TFE layer 453 may be disposed as described above. Alternatively, the TFE structure 450 may have five layers structure where first through fifth TFE layers are stacked one on another or seven layers structure where first through seventh TFE layers are stacked one on another.

The optical module 700 may be disposed in the opening region 20. In one exemplary embodiment, for example, the optical module 700 may include at least one selected from a camera module, a face recognition sensor module, a pupil recognition sensor module, acceleration and geomagnetic sensor modules, proximity and infrared sensor modules and a light intensity sensor module, for example. In an exemplary embodiment, a functional module such as a vibration module or a speaker module may be disposed in the opening region 20.

A conventional OLED device typically includes an opening with an enlarged lower portion in a groove region, such that the upper electrode 340 may be separated in a peripheral region 30. In such a conventional OLED device, for example, the opening having an enlarged lower portion may have an under-cut shape, and a second organic layer 113 with an opening of a first width and a second barrier layer 114 with an opening of a second width may be defined or formed in the peripheral region 30. In such a conventional OLED device, the first width may be greater than the second width, and first opening may overlap the second opening. The second barrier layer 114 located adjacent to the second opening may define a tip, and the upper electrode 340 may be separated in the peripheral region 30 through the tip. However, the tip may be easily damaged by external impacts or a stress in a manufacturing process (e.g., a removal of top and/or bottom protection films, etc.).

When the tip is damaged, the upper electrode 340 may not be separated in the peripheral region 30, and the water, moisture, etc. may permeate through the upper electrode 340. That is, a defect of a pixel included in the conventional OLED device may occur by the water, moisture, etc. In addition, a residue of a photoresist used for patterning a metal layer, etc. may not be completely removed within the opening having an enlarged lower portion, and a layer separation phenomenon may be generated when a first TFE layer 451 is formed. Further, a defect of the conventional OLED device may occur in a subsequent process due to the residue of the photoresist.

In an exemplary embodiment of the invention, the OLED device 100 includes the light emitting layer 330 with the first opening, the upper electrode 340 with the second opening and the capping layer 345 with the third opening inside the groove 930, such that the light emitting layer 330, the upper electrode 340 and the capping layer 345 may be separated (disconnected or shorted) in the groove 930 by the first, second and third openings. In such an embodiment, the light emitting layer 330, the upper electrode 340 and the capping layer 345 may be separated without the opening having an enlarged lower portion (or an under-cut shape). In such an embodiment, since the opening having an enlarged lower portion is not formed, a residue of a photoresist used for patterning a metal layer may be readily removed in the groove 930. That is, the first TFE layer 451 and the third TFE layer 453 may be readily disposed inside the groove 930 of the peripheral region 30. Accordingly, the OLED device 100 may readily block that water, moisture, etc. that permeates into the semiconductor element 250 and the light emitting structure 200.

FIGS. 7 through 20 are cross-sectional views illustrating a method of manufacturing an OLED device in accordance with an exemplary embodiment.

Figure 7:
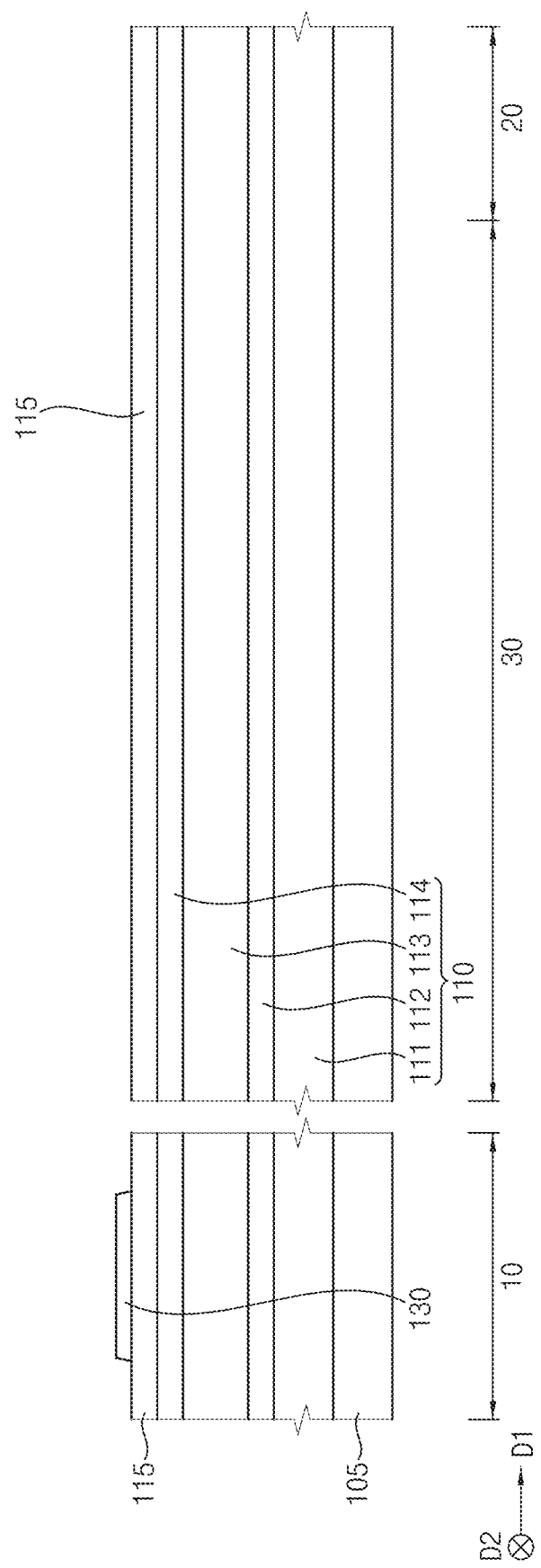
FIGS. 7 through 20 are cross-sectional views illustrating a method of manufacturing an OLED device in accordance with an exemplary embodiment.

Referring to FIG. 7, a rigid glass substrate 105 may be prepared. A first organic layer 111 may be provided or formed on the rigid glass substrate 105. The first organic layer 111 may be provided or formed on the entire rigid glass substrate 105, and may be formed using organic materials having flexibility such as polyimide.

A first barrier layer 112 may be provided or formed on the entire first organic layer 111. The first barrier layer 112 may block moisture or water that permeates through the first organic layer 111. The first barrier layer 112 may be formed using inorganic materials having flexibility such as silicon oxide or silicon nitride, etc. In one exemplary embodiment, for example, the first barrier layer 112 may include at least one selected from SiO, SiN, SiON, SiOC, SiCN, AlO, AlN, TaO, HfO, ZrO and TiO, for example.

A second organic layer 113 may be provided or formed on the first barrier layer 112. The second organic layer 113 may be formed on the entire first barrier layer 112, and may be formed using an organic material having flexibility such as polyimide.

A second barrier layer 114 may be provided or formed on the entire second organic layer 113. The second barrier layer 114 may block moisture or water that may permeate through the second organic layer 113. The second barrier layer 114 may be formed using an inorganic material having flexibility such as SiO or SiN, etc.

Accordingly, a substrate 110 including the first organic layer 111, the first barrier layer 112, the second organic layer 113 and the second barrier layer 114 may be provided or formed as described above.

Since the substrate 110 is relatively thin and flexible, the substrate 110 may be provided or formed on a rigid glass substrate 105 to effectively support the formation of an upper structure thereof (e.g., a semiconductor element and a light emitting structure, etc.). In one exemplary embodiment, for example, after the upper structure is provided or formed on the substrate 110, the rigid glass substrate 105 may be removed. In such an embodiment, it may be difficult to directly form the upper structure on the first and second organic layers 111 and 113 and the first and second barrier layers 112 and 114 because the first and second organic layers 111 and 113 and the first and second barrier layers 112 and 114 are relatively thin and flexible. Accordingly, the upper structure is provided or formed on the substrate 110 and the rigid glass substrate 105, and then the first and second organic layers 111 and 113 and the first and second barrier layers 112 and 114 may serve as the substrate 110 after the removal of the rigid glass substrate 105.

A buffer layer 115 may be provided or formed on the substrate 110. In one exemplary embodiment, for example, the buffer layer 115 may be provided or formed on the entire substrate 110. The buffer layer 115 may effectively prevent the diffusion of metal atoms and/or impurities from the substrate 110 into a semiconductor element and a light emitting structure. In such an embodiment, the buffer layer 115 may control a rate of a heat transfer in a crystallization process for forming an active layer, thereby obtaining substantially uniform active layer. In such an embodiment, the buffer layer 115 may improve a surface flatness of the substrate 110 when a surface of the substrate 110 is relatively irregular. According to a type of the substrate 110, at least two buffer layers 115 may be provided on the substrate 110, or the buffer layer 115 may be omitted. In one exemplary embodiment, for example, the buffer layer 115 may be formed using an organic material or an inorganic material.

An active layer 130 may be provided or formed in the display region 10 on the substrate 110. The active layer 130 may be formed using at least one selected from an oxide semiconductor, an inorganic semiconductor and an organic semiconductor, for example. The active layer 130 may include a source region and a drain region.

Figure 8:
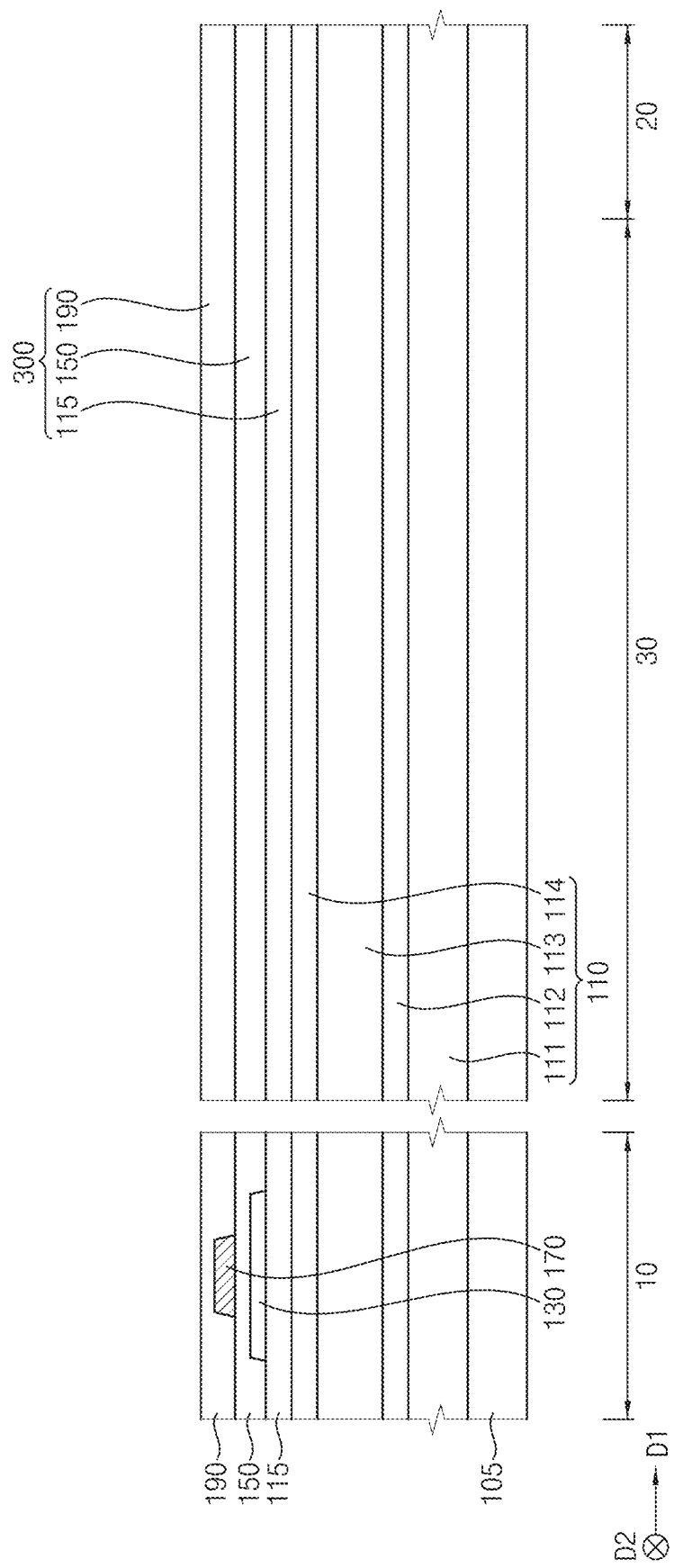

Referring to FIG. 8, a gate insulation layer 150 may be provided or formed on the active layer 130. The gate insulation layer 150 may cover the active layer 130 in the display region 10 on the buffer layer 115, and may extend in a first direction D1 from the display region 10 into the opening region 20 on the buffer layer 115. The gate insulation layer 150 may sufficiently cover the active layer 130 on the buffer layer 115, and may have a substantially flat upper surface without a step around the active layer 130. Alternatively, the gate insulation layer 150 may cover the active layer 130 on the buffer layer 115, and may be formed with a substantially uniform thickness along a profile of the active layer 130. The gate insulation layer 150 may be formed using a silicon compound or a metal oxide, for example. In an exemplary embodiment, the gate insulation layer 150 may have a multi-layered structure including a plurality of insulation layers. In one exemplary embodiment, for example, the insulation layers may have different thicknesses to each other or include different materials to each other.

A gate electrode 170 may be provided or formed in the display region 10 on the gate insulation layer 150. The gate electrode 170 may be provided or formed on a portion of the gate insulation layer 150 under which the active layer 130 is located. The gate electrode 170 may be formed using at least one selected from a metal, a metal alloy, a metal nitride, a conductive metal oxide and a transparent conductive material, for example. These materials may be used alone or in a suitable combination thereof. Alternatively, the gate electrode 170 may have a multi-layered structure including a plurality of layers.

An insulating interlayer 190 may be provided or formed on the gate electrode 170. The insulating interlayer 190 may cover the gate electrode 170 in the display region 10 on the gate insulation layer 150, and may extend in the first direction D1 on the gate insulation layer 150. The insulating interlayer 190 may sufficiently cover the gate electrode 170 on the gate insulation layer 150, and may have a substantially flat upper surface without a step around the first gate electrode 170. Alternatively, the insulating interlayer 190 may cover the gate electrode 170 on the gate insulation layer 150, and may be formed with a substantially uniform thickness along a profile of the gate electrode 170. The insulating interlayer 190 may be formed using a silicon compound or a metal oxide, for example. In an exemplary embodiment, the insulating interlayer 190 may have a multi-layered structure including a plurality of insulation layers. The insulation layers may have different thicknesses from each other or include different materials from each other.

Accordingly, an insulation layer structure 300 including the buffer layer 115, the gate insulation layer 150 and the insulating interlayer 190 may be provided or formed on the substrate 110.

Figure 9:
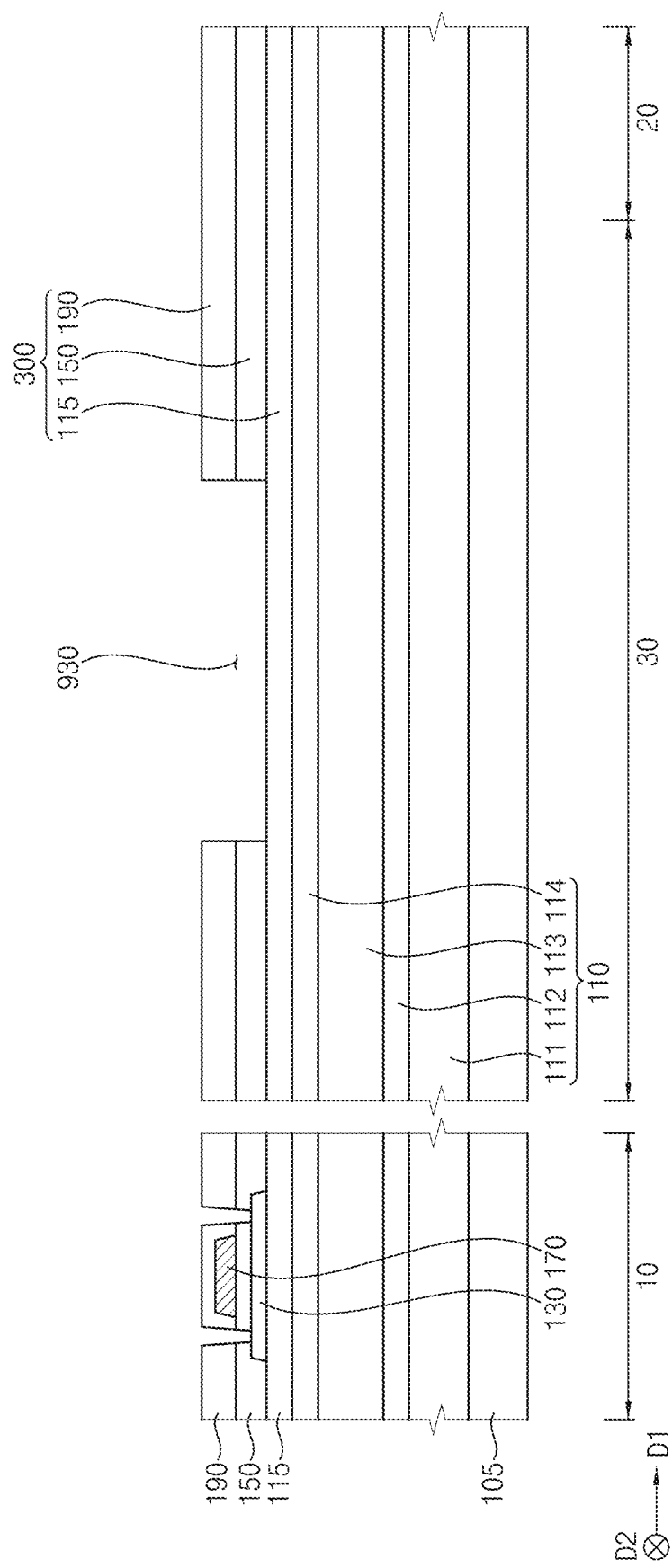

Referring to FIG. 9, a first contact hole may be formed to expose the source region of the active layer 130 by removing a first portion of the gate insulation layer 150 and the insulating interlayer 190, and a second contact hole may be formed to expose the drain region of the active layer 130 by removing a first portion of the gate insulation layer 150 and the insulating interlayer 190.

In such an embodiment, a groove 930 may be formed by removing a portion of the insulation layer structure 300. In one exemplary embodiment, for example, an opening that exposes a portion of an upper surface of the buffer layer 115 in the peripheral region 30 may be formed through the gate insulation layer 150, and an opening that exposes the portion of an upper surface of the buffer layer 115 in the peripheral region 30 may be formed through the insulating interlayer 190. In such an embodiment, the opening of the insulating interlayer 190 may overlap the opening of the gate insulation layer 150, and the openings may define the groove 930 of the insulation layer structure 300. In an exemplary embodiment, the first contact hole, the second contact hole and the groove 930 may be simultaneously formed.

Figure 10:
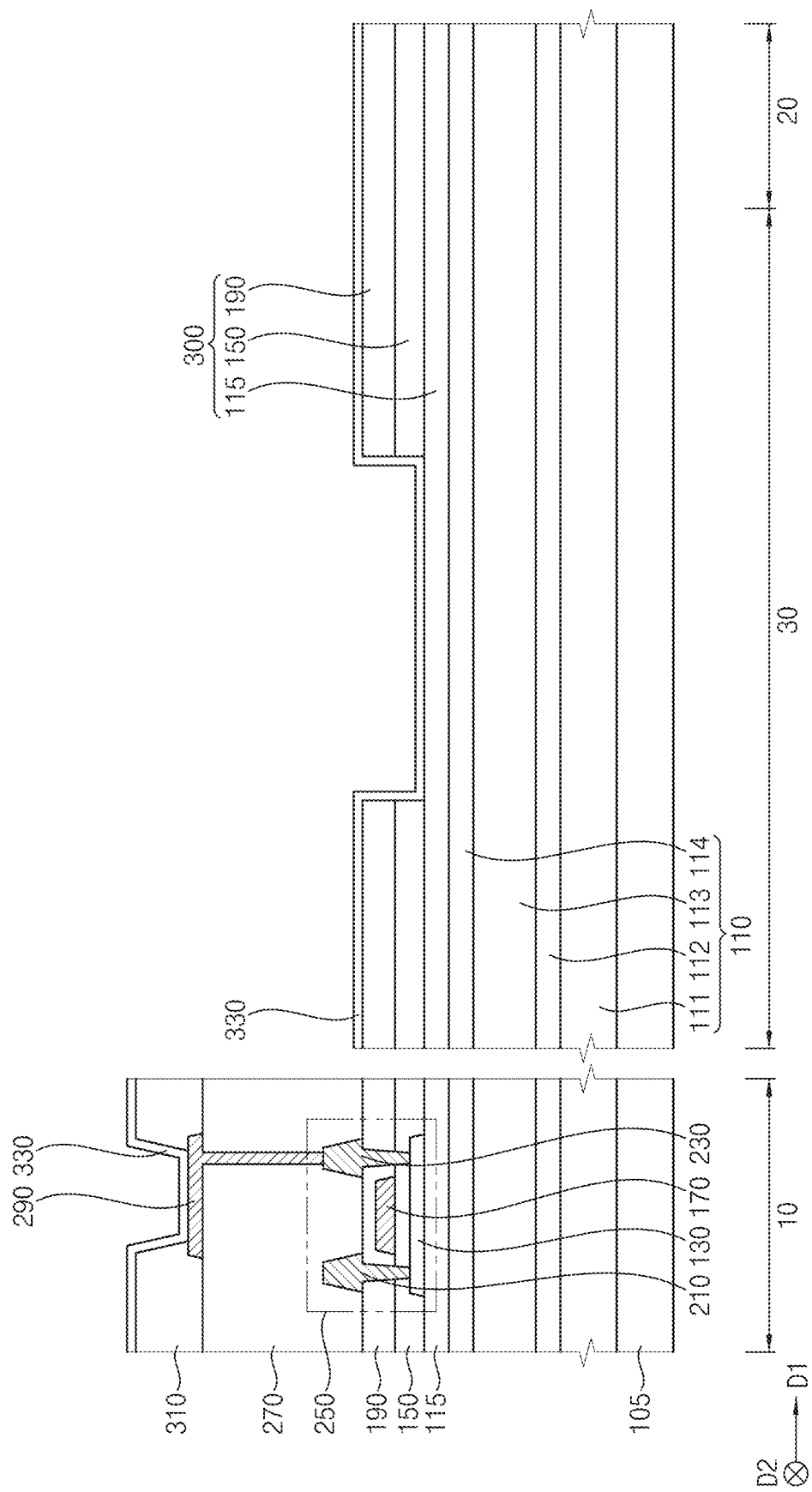

Referring to FIG. 10, a source electrode 210 may fill or be disposed in the first contact hole formed by removing the first portion of the gate insulation layer 150 and the insulating interlayer 190, and may be connected to the source region of the active layer 130. The drain electrode 230 may fill or disposed in the second contact hole formed by removing the second portion of the gate insulation layer 150 and the insulating interlayer 190, and may be connected to the drain region of the active layer 130. Each of the source electrode 210 and the drain electrode 230 may be formed using at least one selected from a metal, an alloy, metal nitride, conductive metal oxide, transparent conductive materials, etc. These may be used alone or in a suitable combination thereof. In an exemplary embodiment, each of the source and drain electrodes 210 and 230 may have a multi-layered structure including a plurality of layers.

Accordingly, a semiconductor element 250 including the active layer 130, the gate electrode 170, the source electrode 210 and the drain electrode 230 may be provided or formed on the buffer layer 115.

A planarization layer 270 may be provided or formed in the display region 10 on the insulating interlayer 190, the source electrode 210, and the drain electrode 230. The planarization layer 270 may cover the source and drain electrodes 210 and 230 in the display region 10 on the insulating interlayer 190, and may not be provided or formed in the peripheral region 30. That is, the planarization layer 270 may be provided or formed only in the display region 10 on the insulating interlayer 190. Alternatively, the planarization layer 270 may be provided or formed in the peripheral region 30 on a portion of the insulation layer structure 300 located adjacent to a boundary of the display region 10 and the peripheral region 30, and may not be provided or formed in the peripheral region 30 on another portion of the insulation layer structure 300 located adjacent to a boundary of the peripheral region 30 and the opening region 20.

The planarization layer 270 may be formed to have a great thickness in the display region 10, e.g., with a sufficiently great thickness to allow the planarization layer 270 to have a substantially flat upper surface. In such an embodiment, the planarization layer 270 may have a substantially flat upper surface, and a planarization process may be further performed on the planarization layer 270 to implement the flat upper surface of the planarization layer 270. Alternatively, the planarization layer 270 may be formed with a substantially uniform thickness along a profile of the source and drain electrodes 210 and 230 in the display region 10 on the insulating interlayer 190. The planarization layer 270 may include an organic material or an inorganic material. In an exemplary embodiment, the planarization layer 270 may be formed using an organic material. In one exemplary embodiment, for example, the planarization layer 270 may include at least one selected from a photoresist, a polyacryl-based resin, a polyimide-based resin, a polyamide-based resin, a siloxane-based resin, an acryl-based resin and an epoxy-based resin, for example.

A lower electrode 290 may be provided or formed in the display region 10 on the planarization layer 270. The lower electrode 290 may be connected to the drain electrode 230 via a contact hole formed by removing a portion of the planarization layer 270, and the lower electrode 290 may be electrically connected to the semiconductor element 250. The lower electrode 290 may be formed using at least one selected from a metal, a metal alloy, a metal nitride, a conductive metal oxide and a transparent conductive material, for example. These may be used alone or in a suitable combination thereof. In an exemplary embodiment, the lower electrode 290 may have a multi-layered structure including a plurality of layers.

A pixel defining layer 310 may be provided or formed in the display region 10 on the planarization layer 270, and may not be disposed in the peripheral region 30. That is, the pixel defining layer 310 may be provided or formed only in the display region 10. Alternatively, the pixel defining layer 310 may be provided or formed in the peripheral region 30 on a portion of the insulation layer structure 300 located adjacent to a boundary of the display region 10 and the peripheral region 30, and may not be provided or formed in the peripheral region 30 on another portion of the insulation layer structure 300 located adjacent to a boundary of the peripheral region 30 and the opening region 20.

The pixel defining layer 310 may cover both portions of the lower electrode 290, and may expose a portion of an upper surface of the lower electrode 290. The pixel defining layer 310 may include an organic material or an inorganic material. In an exemplary embodiment, the pixel defining layer 310 may be formed using an organic material.

In the display region 10, a light emitting layer 330 may be provided or formed on the pixel defining layer 310 and the lower electrode 290. The light emitting layer 330 may extend in the first direction D1, and may be provided or formed in the peripheral region 30 on the insulating interlayer 190. In an exemplary embodiment, the light emitting layer 330 may be continuously provided or formed inside the groove 930.

Figure 11:
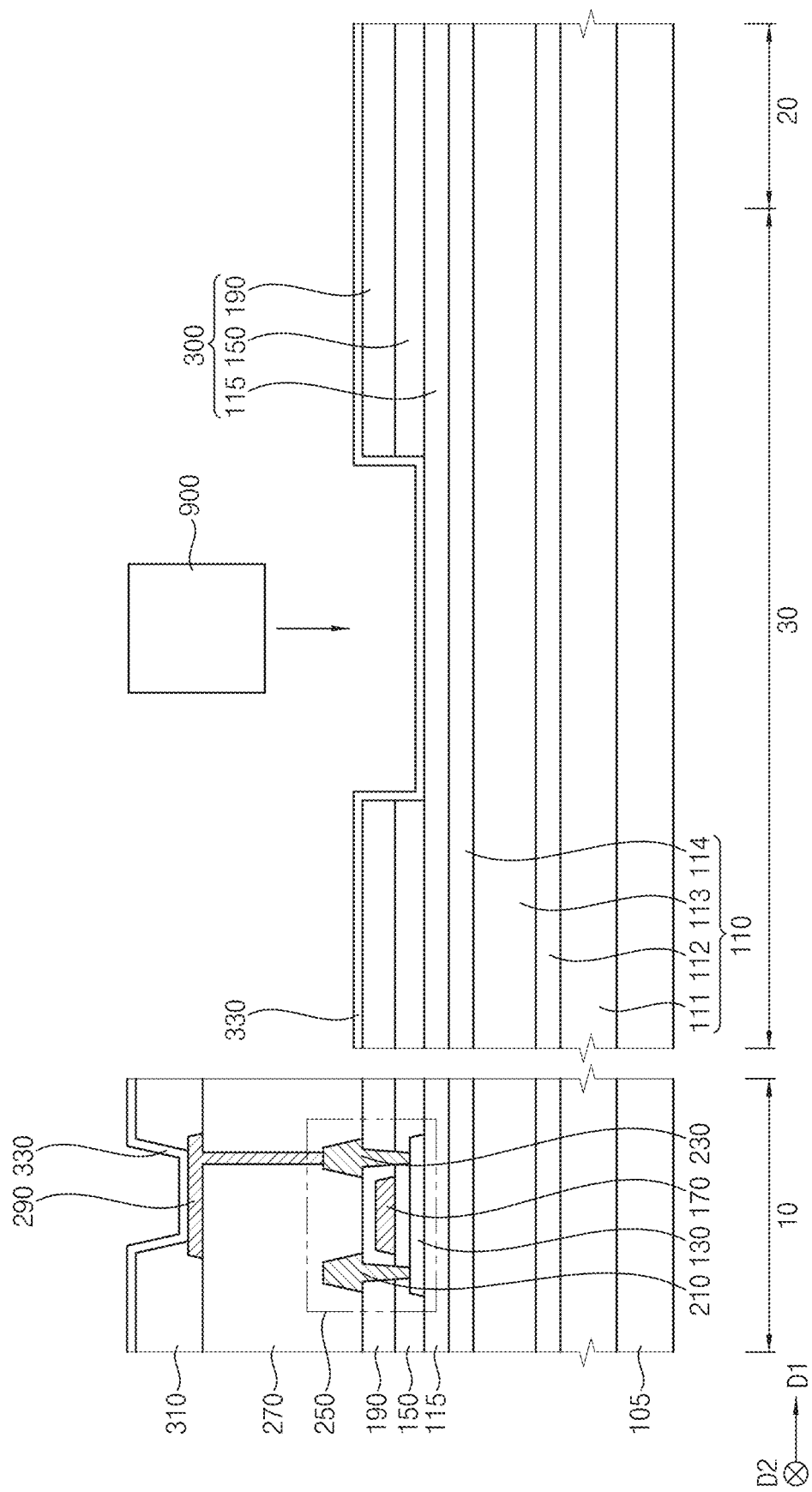

Referring to FIG. 11, a first patterning member 900 may be positioned to overlap the groove 930. In an exemplary embodiment, a width, which extends in the first direction D1, of the first patterning member 900 may be less than a width, which extends in the first direction D1, of the groove 930. In such an embodiment, after the first patterning member 900 is heated in a chamber of a vacuum state during a predetermined time, the first patterning member 900 may be in direct contact with the light emitting layer 330. The first patterning member 900 may be formed using epoxy or polydimethylsiloxane ("PDMS"), for example.

In one exemplary embodiment, for example, when the first patterning member 900 is in direct contact with an organic layer, the organic layer may adhere to the first patterning member 900. After the first patterning member 900 is in direct contact with the organic layer, an opening may be formed in a portion where the first patterning member 900 is in direct contact with the organic layer when the first patterning member 900 is disposed apart from the organic layer. That is, a portion of the organic layer may be removed (e.g., a lift-off method).

Figure 12:
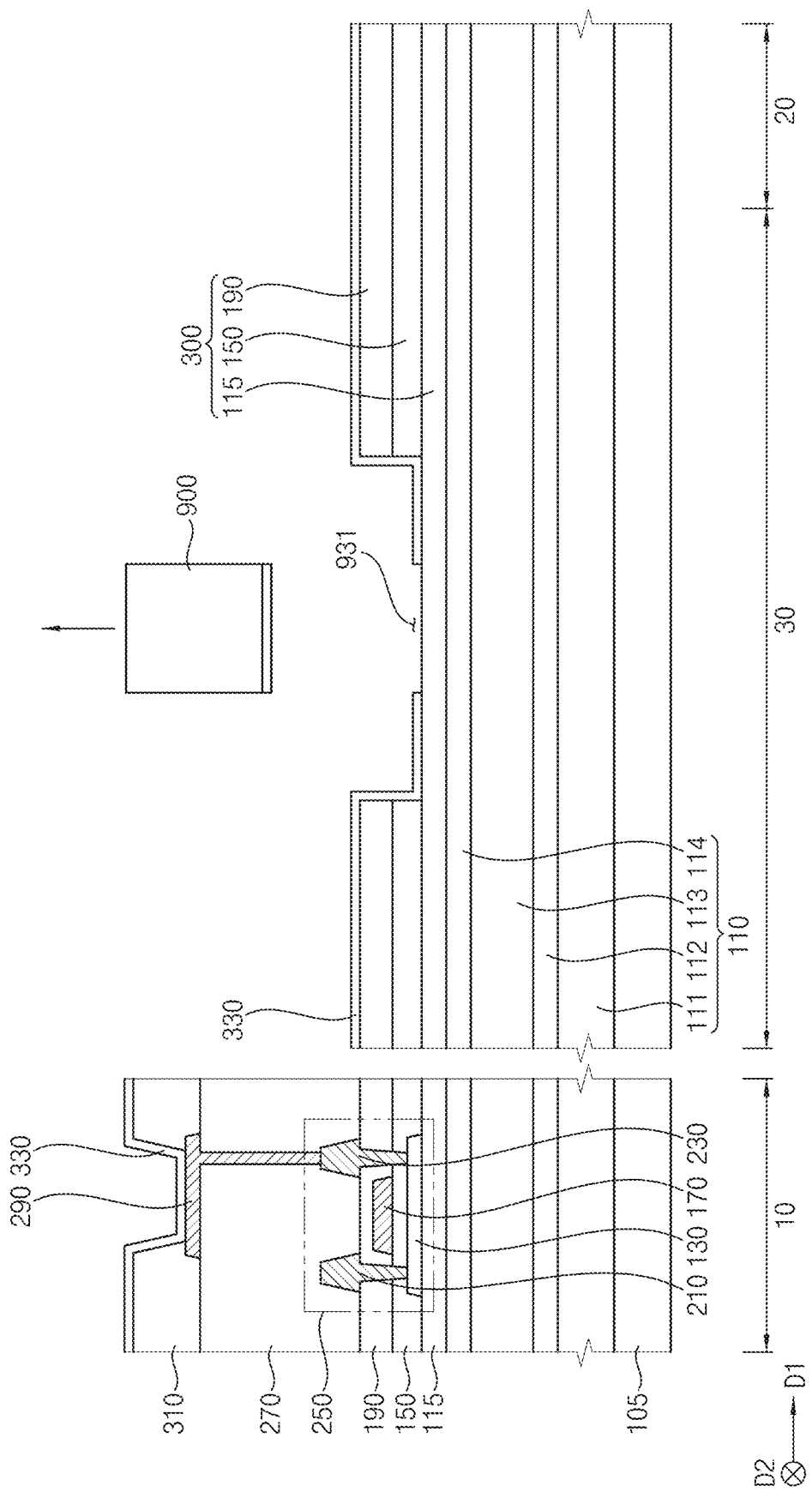

Referring to FIG. 12, after the first patterning member 900 is in direct contact with the light emitting layer 330, the first patterning member 900 may be disposed apart from the light emitting layer 330. In such an embodiment, a portion of the light emitting layer 330 may adhere to a lower surface of the first patterning member 900. In such an embodiment, the light emitting layer 330 may include a first opening 931 that exposes a portion of an upper surface of the buffer layer 115 located in the peripheral region 30. In such an embodiment, the first opening 931 of the light emitting layer 330 may be located inside the groove 930, and the light emitting layer 330 may be separated in the peripheral region 30 by the first opening 931.

The light emitting layer 330 may have a multi-layered structure including an EML, an HIL, an HTL, an ETL, an EIL, etc. In an exemplary embodiment, the EML, the HIL, the HTL, the ETL and the EIL may be provided or formed in the peripheral region 30. In an exemplary embodiment, the HIL, the HTL, the ETL and the EIL may be provided or formed in the peripheral region 30 except for the EML.

The EML of the light emitting layer 330 may be formed using at least one of light emitting materials capable of generating different colors of light (e.g., a red color of light, a blue color of light, and a green color of light, etc.) according to sub-pixels. Alternatively, the EML of the light emitting layer 330 may generally generate a white color of light by stacking a plurality of light emitting materials capable of generating different colors of light such as a red color of light, a green color of light, a blue color of light, etc. In such an embodiment, a color filter may be formed on the light emitting layer 330 that is located on the lower electrode 290. The color filter may include at least one selected from a red color filter, a green color filter, and a blue color filter. Alternatively, the color filter may include at least one selected from a yellow color filter, a cyan color filter, and a magenta color filter. The color filter may be formed using a photosensitive resin or a color photoresist, for example.

Figure 13:
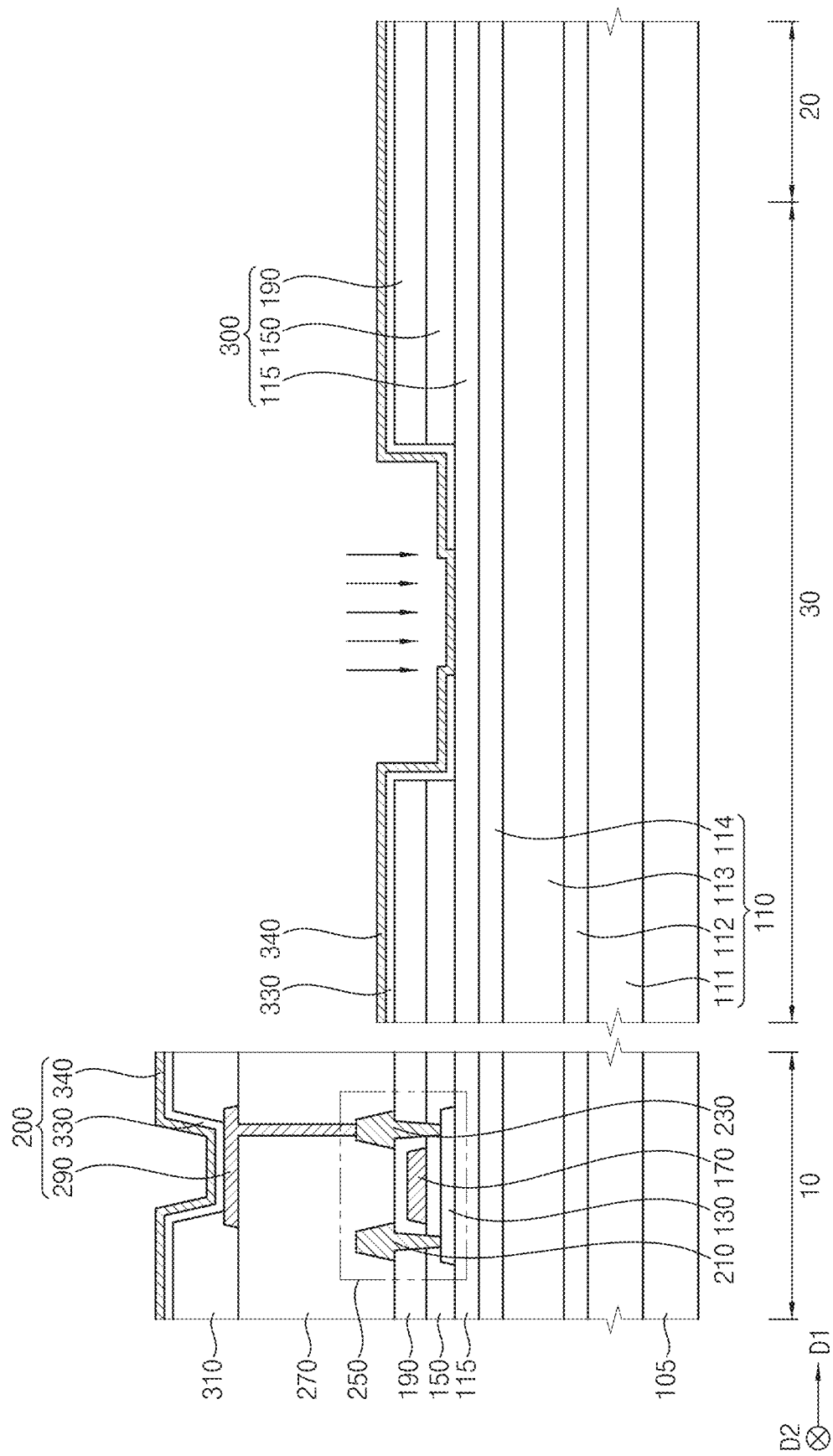

Referring to FIG. 13, in the display region 10, an upper electrode 340 may be provided or formed to overlap the light emitting layer 330. The upper electrode 340 may extend in the first direction D1 on the light emitting layer 330, and may be provided or formed in the peripheral region 30. In an exemplary embodiment, the upper electrode 340 may be continuously provided or formed inside the groove 930.

After the upper electrode 340 is provided or formed the entire light emitting layer 330, an etch process may be performed in a portion of the upper electrode 340 that is formed in the groove 930.

Figure 14:
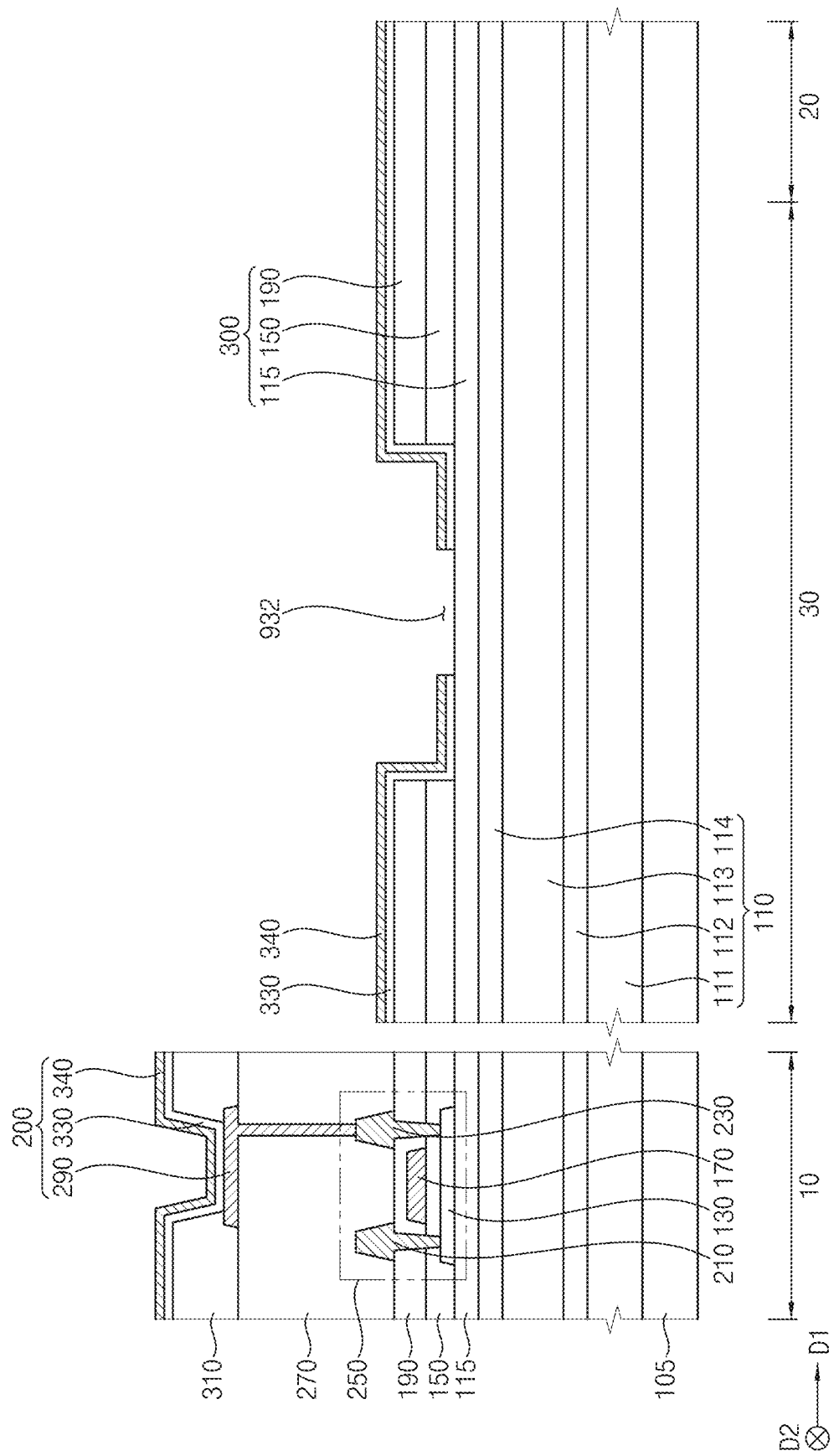

Referring to FIG. 14, by performing the etch process in the portion of the upper electrode 340 that is formed in the groove 930, a second opening 932 that exposes the portion of an upper surface of the buffer layer 115 located in the peripheral region 30 is formed through the upper electrode 340. That is, the second opening 932 of the upper electrode 340 may be located inside the groove 930. In such an embodiment, the second opening 932 of the upper electrode 340 may overlap the first opening 931 of the light emitting layer 330. In such an embodiment, the upper electrode 340 may be separated in the peripheral region 30 by the second opening 932.

The upper electrode 340 may be formed using at least one selected from a metal, a metal alloy, a metal nitride, a conductive metal oxide and a transparent conductive material, for example. In one exemplary embodiment, for example, the upper electrode 340 may include at least one selected from Au, Ag, Al, Pt, Ni, Ti, Pd, Mg, Ca, Li, Cr, Ta, W, Cu, Mo, Sc, Nd, Ir, an alloy of aluminum, AlN, an alloy of silver, WN, an alloy of copper, an alloy of molybdenum, TiN, CrN, TaN, SRO, ZnO, ITO, SnO, InO, GaO and IZO, for example. These materials may be used alone or in a suitable combination thereof. In an exemplary embodiment, the upper electrode 340 may have a multi-layered structure including a plurality of layers.

In an exemplary embodiment, a light emitting structure 200 including the lower electrode 290, the light emitting layer 330 and the upper electrode 340 may be provided or formed as described above.

Figure 15:
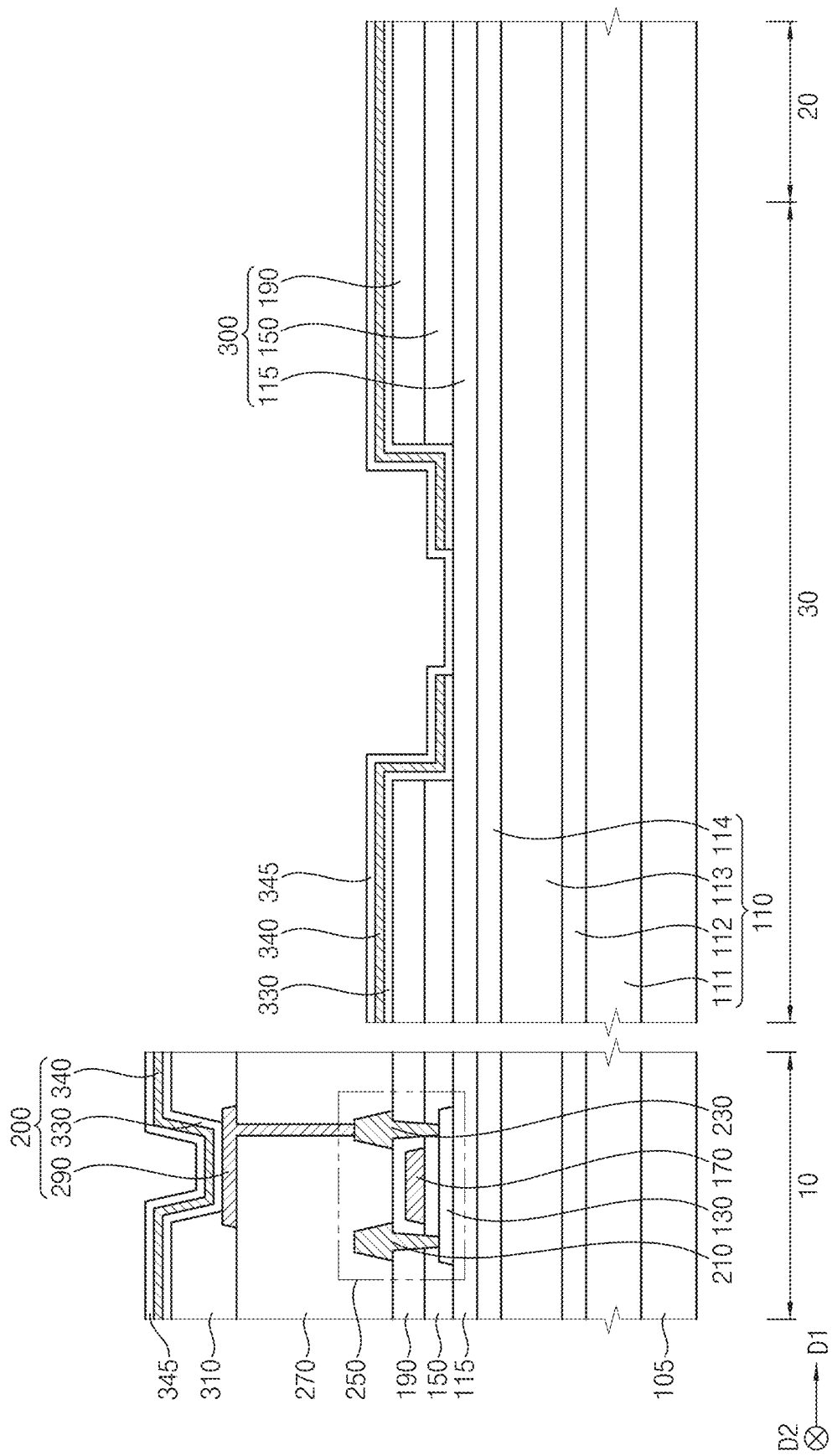

Referring to FIG. 15, in the display region 10, a capping layer 345 may be provided or formed to overlap the upper electrode 340. The capping layer 345 may extend in the first direction D1 on the upper electrode 340, and may be provided or formed in the peripheral region 30. In an exemplary embodiment, the capping layer 345 may be continuously provided or formed inside the groove 930.

Figure 16:
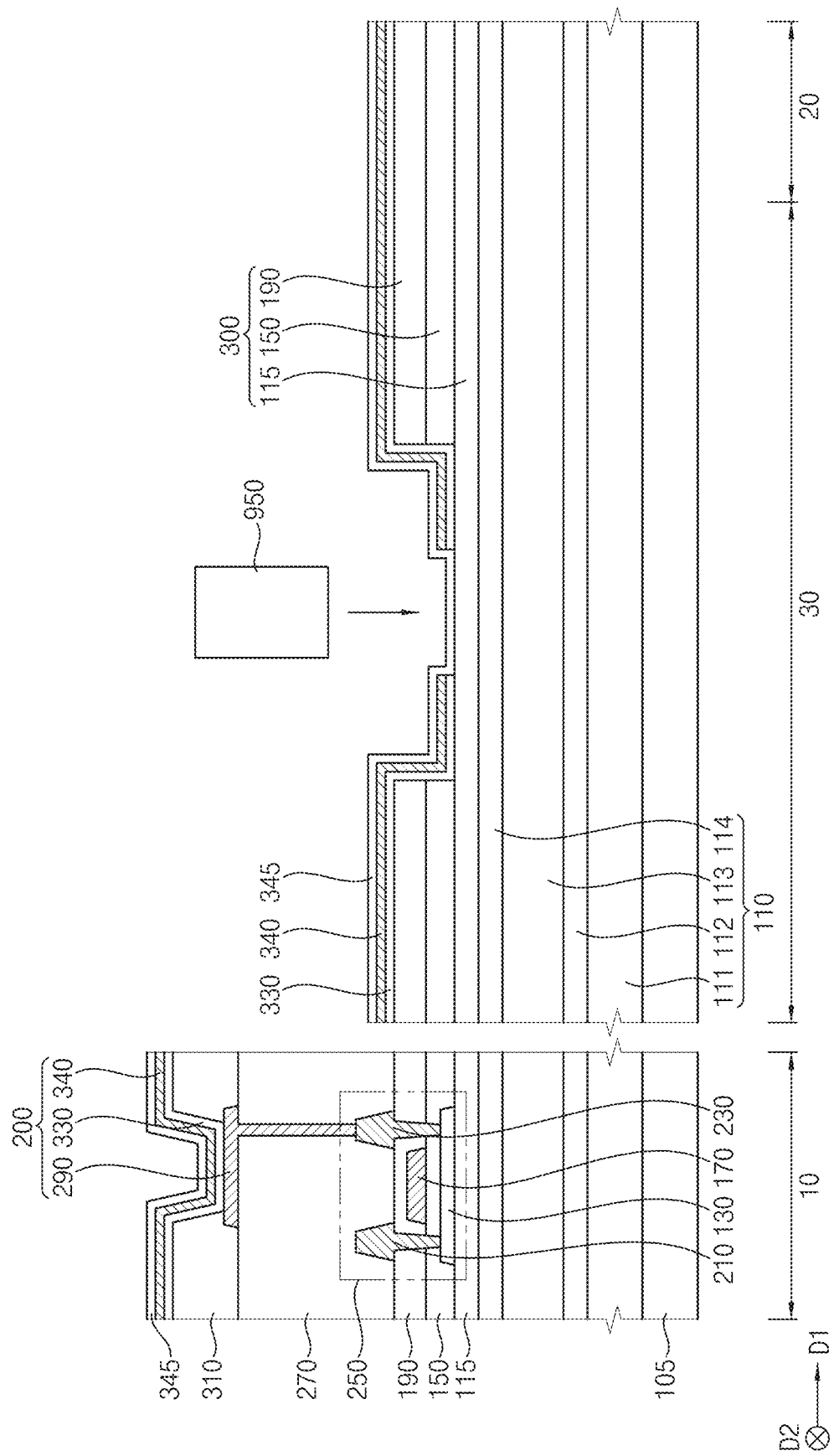

Referring to FIG. 16, a second patterning member 950 may be positioned to overlap the groove 930. In an exemplary embodiment, a width, which extends in the first direction D1, of the second patterning member 950 may be less than a width, which extends in the first direction D1, of the groove 930, and may be less than a width of the first opening 931. In such an embodiment, after the second patterning member 950 is heated in the chamber of a vacuum state during a predetermined time, the second patterning member 950 may be in direct contact with the capping layer 345. The second patterning member 950 may be formed using epoxy or PDMS, for example. That is, the second patterning member 950 may be a substantially same as the first patterning member 900 except from a width which extends in the first direction D1. Alternatively, a width, which extends in the first direction D1, of the first patterning member 900 may be a substantially same as a width, which extends in the first direction D1, the second patterning member 950. In such an embodiment, an OLED device 100 illustrated in FIG. 6 may be manufactured.

Figure 17:
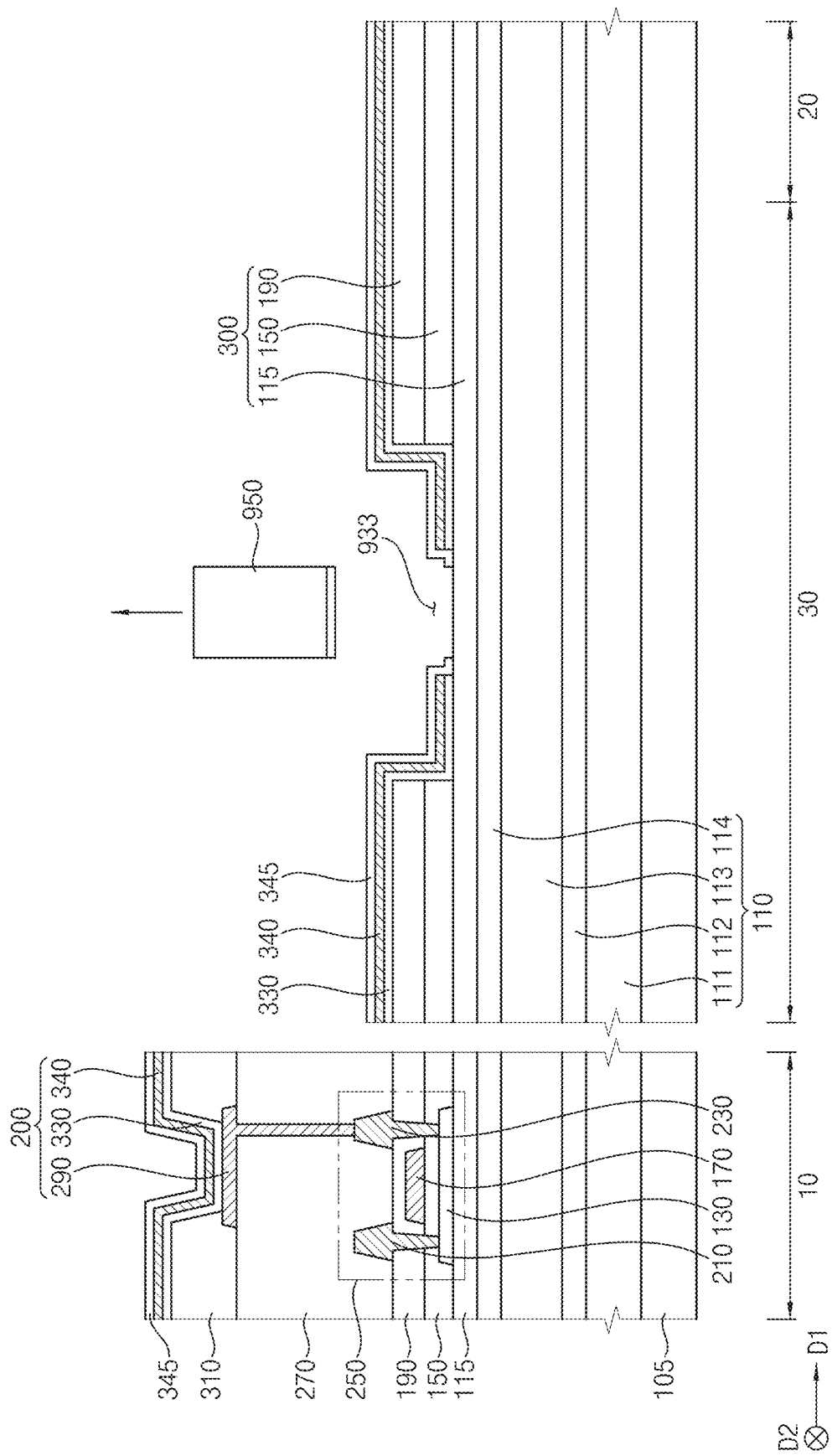

Referring to FIG. 17, after the second patterning member 950 is in direct contact with the capping layer 345, the second patterning member 950 may be disposed apart from the capping layer 345. In such an embodiment, a portion of the capping layer 345 may adhere to a lower surface of the second patterning member 950. In such an embodiment, a third opening 933 that exposes the portion of an upper surface of the buffer layer 115 located in the peripheral region 30 is formed through the capping layer 345. That is, the third opening 933 of the capping layer 345 may be located inside the groove 930, and the capping layer 345 may be separated in the peripheral region 30 by the third opening 933. In an exemplary embodiment, a width of the third opening 933 may be less than a width of each of the first and second openings 931 and 932. Accordingly, the capping layer 345 may cover side end portions of the light emitting layer 330 and the upper electrode 340 each inside the groove 930. In such an embodiment, the capping layer 345 may cover lateral surfaces of the light emitting layer 330 by which the first opening 931 is defined and lateral surfaces of the upper electrode 340 by which the second opening 932 is defined.

The capping layer 345 may protect the light emitting structure 200, and may include an organic material or an inorganic material. In one exemplary embodiment, for example, the capping layer 345 may be formed using an organic material such as a triamine derivative, arylenediamine derivative, CBP, Alq3, etc.

Figure 18:
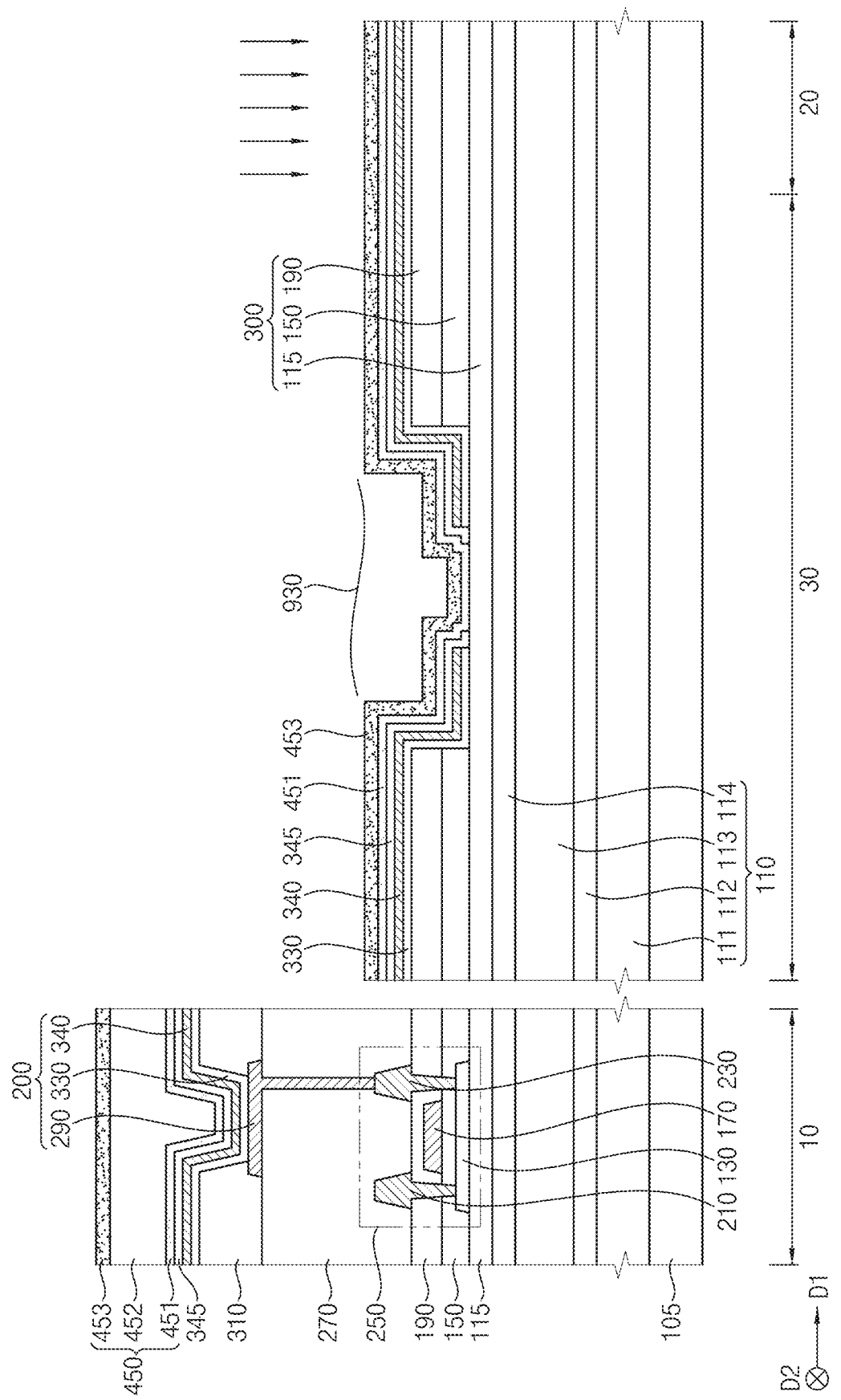

Referring to FIG. 18, a first TFE layer 451 may be provided or formed in the display region 10 and the peripheral region 30 on the capping layer 345. The first TFE layer 451 may cover the capping layer 345 in the display region 10, and may be provided or formed with a substantially uniform thickness along a profile of the capping layer 345 and extend in the peripheral region 30. The first TFE layer 451 may be provided or formed along a profile of the capping layer 345 in the peripheral region 30. In an exemplary embodiment, the first TFE layer 451 may be in direct contact with the portion of an upper surface of the buffer layer 115 through the third opening 933. The first TFE layer 451 may prevent the light emitting structure 200 from being deteriorated by the permeation of moisture, water, oxygen, etc. In such an embodiment, the first TFE layer 451 may protect the light emitting structure 200 from external impacts. The first TFE layer 451 may be formed using an inorganic material having flexibility.

A second TFE layer 452 may be formed in the display region 10 on the first TFE layer 451, and may not be formed in the peripheral region 30. That is, the second TFE layer 452 may be provided or formed only in the display region 10. Alternatively, the second TFE layer 452 may be provided or formed in the peripheral region 30 on a portion of the insulation layer structure 300 located adjacent to a boundary of the display region 10 and the peripheral region 30, and may not be provided or formed in the peripheral region 30 on another portion of the insulation layer structure 300 located adjacent to a boundary of the peripheral region 30 and the opening region 20.

The second TFE layer 452 may improve the flatness of an OLED device, and may protect the light emitting structure 200. The second TFE layer 452 may be formed using an organic material having the flexibility.

A third TFE layer 453 may be provided or formed in the display region 10 on the second TFE layer 452 and in the peripheral region 30 on the first TFE layer 451. The third TFE layer 453 may cover the second TFE layer 452 in the display region 10 and be formed with a substantially uniform thickness along a profile of the second TFE layer 452, and may extend in the peripheral region 30. The third TFE layer 453 may cover the first TFE layer 451 in the peripheral region 30, and may be formed with a substantially uniform thickness along a profile of the first TFE layer 451. The third TFE layer 453 together with the first TFE layer 451 may prevent the light emitting structure 200 from being deteriorated by the permeation of moisture, water, oxygen, etc. In such an embodiment, the third TFE layer 453 together with the first and second TFE layers 451 and 452 may protect the light emitting structure 200 from external impacts. The third TFE layer 453 may be formed using an inorganic material having the flexibility.

Accordingly, a TFE structure 450 including the first TFE layer 451, the second TFE layer 452 and the third TFE layer 453 may be provided or formed as described above.

After the TFE structure 450 is provided or formed, a laser may be irradiated in the opening region 20 on the TFE structure 450. Alternatively, a different etch process may be performed to expose the opening region 20 on the TFE structure 450.

Figure 19:
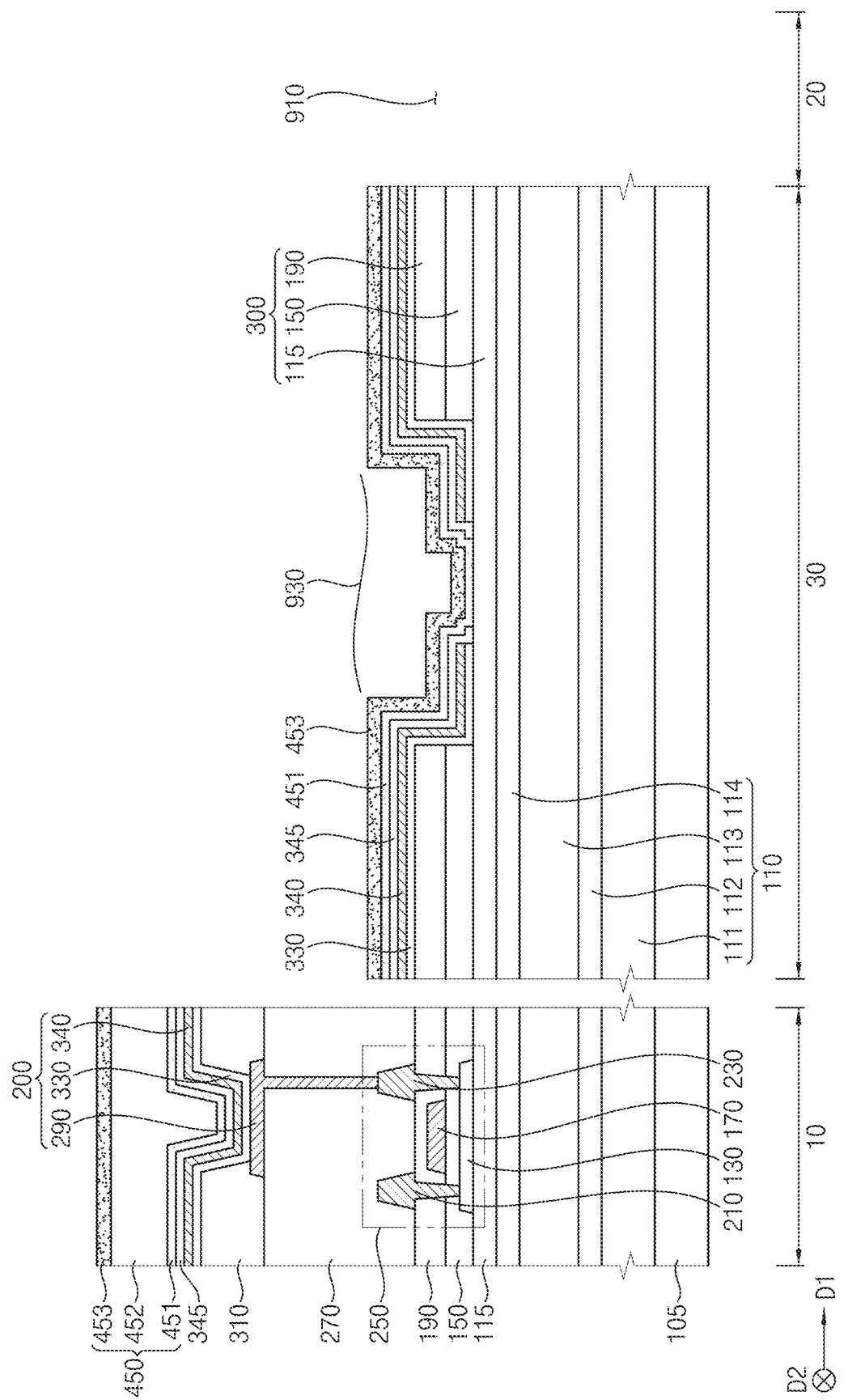
Figure 20:
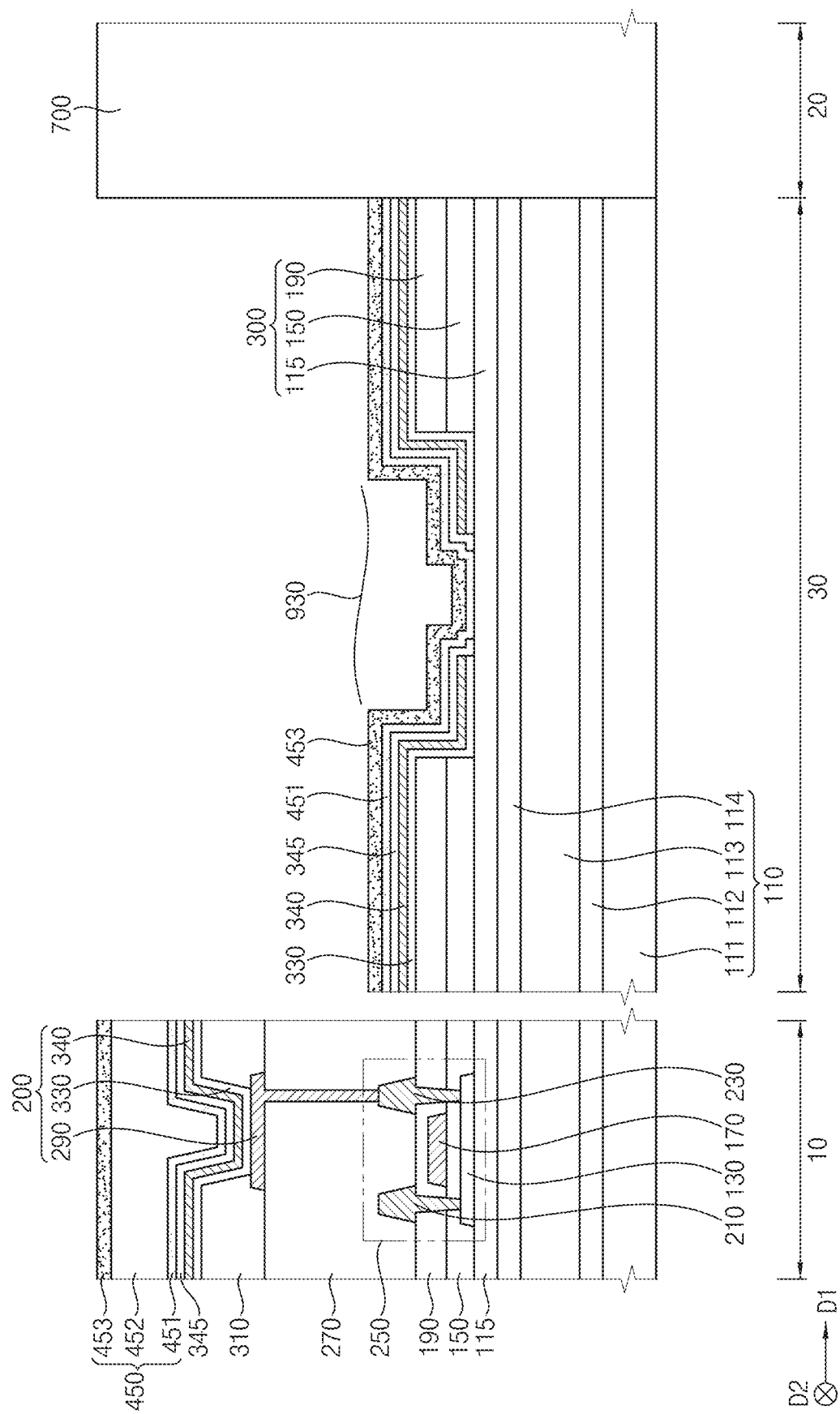

Referring to FIGS. 19 and 20, an opening 910 may be formed in the opening region 20 through the laser irradiation, and an optical module 700 may be provided or disposed in the opening 910. In one exemplary embodiment, for example, the optical module 700 may include at least one selected from a camera module, a face recognition sensor module, a pupil recognition sensor module, acceleration and geomagnetic sensor modules, proximity and infrared sensor modules and a light intensity sensor module, for example. After the optical module 700 is provided, the rigid glass substrate 105 may be removed from the substrate 110. Accordingly, an OLED device illustrated in FIG. 20 may be manufactured.

In an exemplary embodiment of a method of manufacturing the OLED device, the first opening 931 is formed through the light emitting layer 330, the second opening 932 is formed through the upper electrode 340, and the third opening 933 is formed through the capping layer 345 by using the first patterning member 900 and the second patterning member 950. Accordingly, the light emitting layer 330, the upper electrode 340 and the capping layer 345 may be disconnected or shorted inside the groove 930 by the first, second and third openings 931, 932 and 933 without an opening having an enlarged lower portion (or an under-cut shape), and the OLED device may readily block that water, moisture, etc. that permeates into the semiconductor element 250 and the light emitting structure 200.

Figure 21:
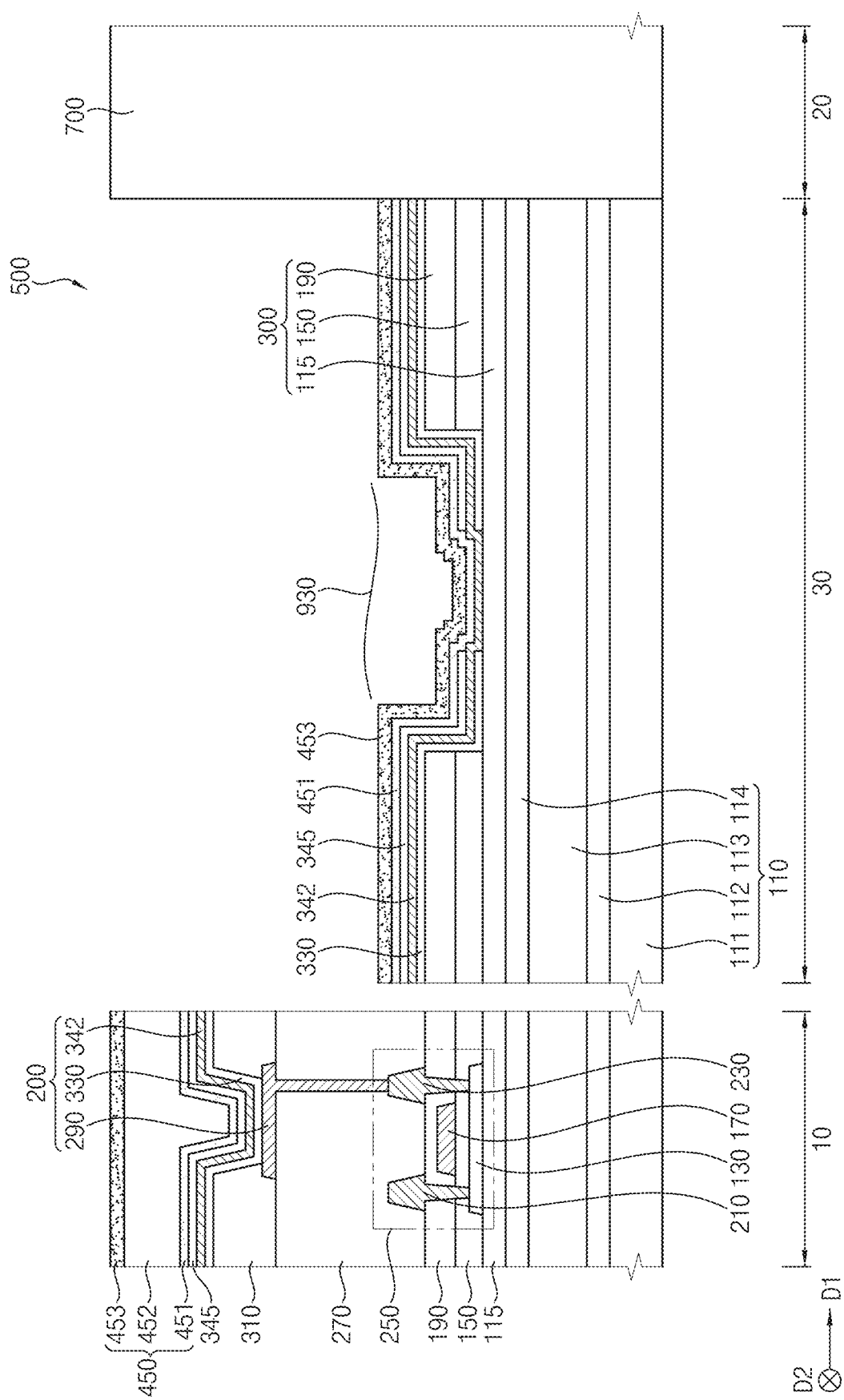
FIG. 21 is a cross-sectional view illustrating an OLED device in accordance with an alternative exemplary embodiment.

FIG. 21 is a cross-sectional view illustrating an OLED device in accordance with an alternative exemplary embodiment. An OLED device 500 illustrated in FIG. 21 may have a configuration substantially the same as or similar to that of an OLED device 100 described with reference to FIGS. 1 through 6 except for an upper electrode 342. In FIG. 21, any repetitive detailed descriptions for elements that are substantially the same as or similar to elements described with reference to FIGS. 1 through 6 may be omitted.

Referring to FIGS. 1 through 6 and 21, an exemplary embodiment of an OLED device 500 may include a substrate 110, an insulation layer structure 300, a semiconductor element 250, a planarization layer 270, a light emitting structure 200, a pixel defining layer 310, a capping layer 345, a TFE structure 450, an optical module 700, etc. In such an embodiment, the insulation layer structure 300 may include a buffer layer 115, a gate insulation layer 150 and insulating interlayer 190, and the light emitting structure 200 may include a lower electrode 290, a light emitting layer 330 and an upper electrode 342. In such an embodiment, the TFE structure 450 may include a first TFE layer 451, a second TFE layer 452 and a third TFE layer 453.

In the display region 10, the upper electrode 342 may be disposed to overlap the light emitting layer 330. The upper electrode 342 may extend in the first direction D1 on the light emitting layer 330, and may be disposed in the peripheral region 30. In an exemplary embodiment, the upper electrode 342 may be continuously disposed inside the groove 930.

In one exemplary embodiment, for example, the upper electrode 342 may fill or disposed in a first opening of the light emitting layer 330, and the upper electrode 342 may be in direct contact with an upper surface of the buffer layer 115 located inside of a groove 930. In such an embodiment, the upper electrode 342 may cover side end portions of the light emitting layer 330 inside the groove 930, and may be in direct contact with the first TFE layer 451 in a third opening of the capping layer 345.

In one exemplary embodiment, for example, where the upper electrode 342 is not used as a permeability path for water and/or moisture, the upper electrode 342 may be continuously disposed in the peripheral region 30, and the light emitting layer 330 and the capping layer 345 that are capable of being used as a permeability path for water and/or moisture may be separated in the peripheral region 30 through the first and second openings.

Figure 22:
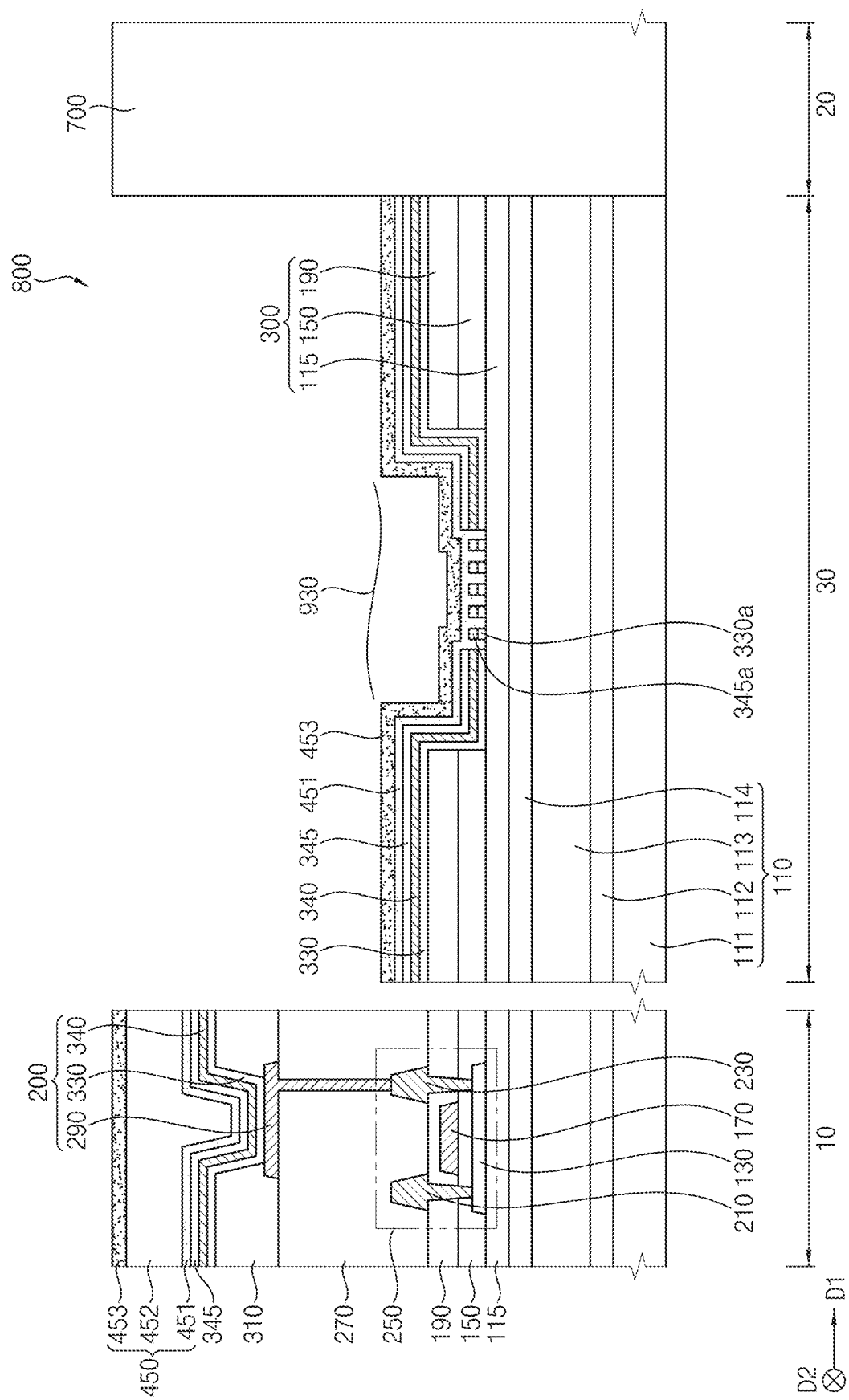
FIG. 22 is a cross-sectional view illustrating an OLED device in accordance with another alternative exemplary embodiment.

FIG. 22 is a cross-sectional view illustrating an OLED device in accordance with another alternative exemplary embodiment. An OLED device 800 illustrated in FIG. 22 may have a configuration substantially the same as or similar to that of an OLED device 100 described with reference to FIGS. 1 through 6 except for light emitting layer patterns 330a and capping layer patterns 345a. In FIG. 22, any repetitive detailed descriptions for elements that are substantially the same as or similar to elements described with reference to FIGS. 1 through 6 may be omitted.

Referring to FIGS. 1 through 6 and 22, an exemplary embodiment of an OLED device 800 may include a substrate 110, an insulation layer structure 300, a semiconductor element 250, a planarization layer 270, a light emitting structure 200, a pixel defining layer 310, a capping layer 345, a TFE structure 450, an optical module 700, etc. In such an embodiment, the insulation layer structure 300 may include a buffer layer 115, a gate insulation layer 150 and insulating interlayer 190, and the light emitting structure 200 may include a lower electrode 290, a light emitting layer 330 and an upper electrode 340. In such an embodiment, the TFE structure 450 may include a first TFE layer 451, a second TFE layer 452 and a third TFE layer 453.

In the display region 10, the light emitting layer 330 may be disposed on the pixel defining layer 310 and the lower electrode 290. The light emitting layer 330 may extend in the first direction D1, and may be disposed in the peripheral region 30 on the insulating interlayer 190. In an exemplary embodiment, the light emitting layer 330 may be disposed inside the groove 930, and a first opening (e.g., a first opening 931 of FIG. 12) that exposes the portion of an upper surface of the buffer layer 115 located in the peripheral region 30 may be defined. That is, the first opening of the light emitting layer 330 may be located inside of the groove 930. In such an embodiment, light emitting layer patterns 330a may be disposed in the first opening. In such an embodiment, the light emitting layer 330 may be disconnected or separated in the peripheral region 30 by the first opening and the light emitting layer patterns 330a.

In an exemplary embodiment, as illustrated in FIGS. 11 and 12, the first opening of the light emitting layer 330 may be formed using a first patterning member 900. In an exemplary embodiment, when a lower surface of the first patterning member 900 has a concave-convex shape, the light emitting layer patterns 330a may be formed in the first opening.

In the display region 10, the capping layer 345 may be disposed to overlap the upper electrode 340. The capping layer 345 may extend in the first direction D1 on the upper electrode 340, may be disposed in the peripheral region 30. In an exemplary embodiment, the capping layer 345 may be disposed inside the groove 930, and a third opening (e.g., a third opening 933 of FIG. 17) that exposes the portion of an upper surface of the buffer layer 115 located in the peripheral region 30 may be defined through the capping layer 345. In such an embodiment, the third opening of the capping layer 345 may be located inside of the groove 930. In such an embodiment, capping layer patterns 345a may be disposed in the third opening. In such an embodiment, the capping layer 345 may be separated in the peripheral region 30 by the third opening and capping layer patterns 345a.

In an exemplary embodiment, as illustrated in FIGS. 16 and 17, the third opening of the capping layer 345 may be formed using a second patterning member 950. In an exemplary embodiment, when a lower surface of the second patterning member 950 has a concave-convex shape, the capping layer patterns 345a may be formed in the third opening.

The first TFE layer 451 may be disposed in the display region 10 and the peripheral region 30 on the capping layer 345. The first TFE layer 451 may cover the capping layer 345 in the display region 10, and may be disposed with a substantially uniform thickness along a profile of the capping layer 345 and extend in the peripheral region 30. The first TFE layer 451 may be disposed along a profile of the capping layer 345 in the peripheral region 30. In an exemplary embodiment, the first TFE layer 451 may be in direct contact with the portion of an upper surface of the buffer layer 115 through the first, second and third openings, the light emitting layer patterns 330a, and the capping layer patterns 345a.

Figure 23:
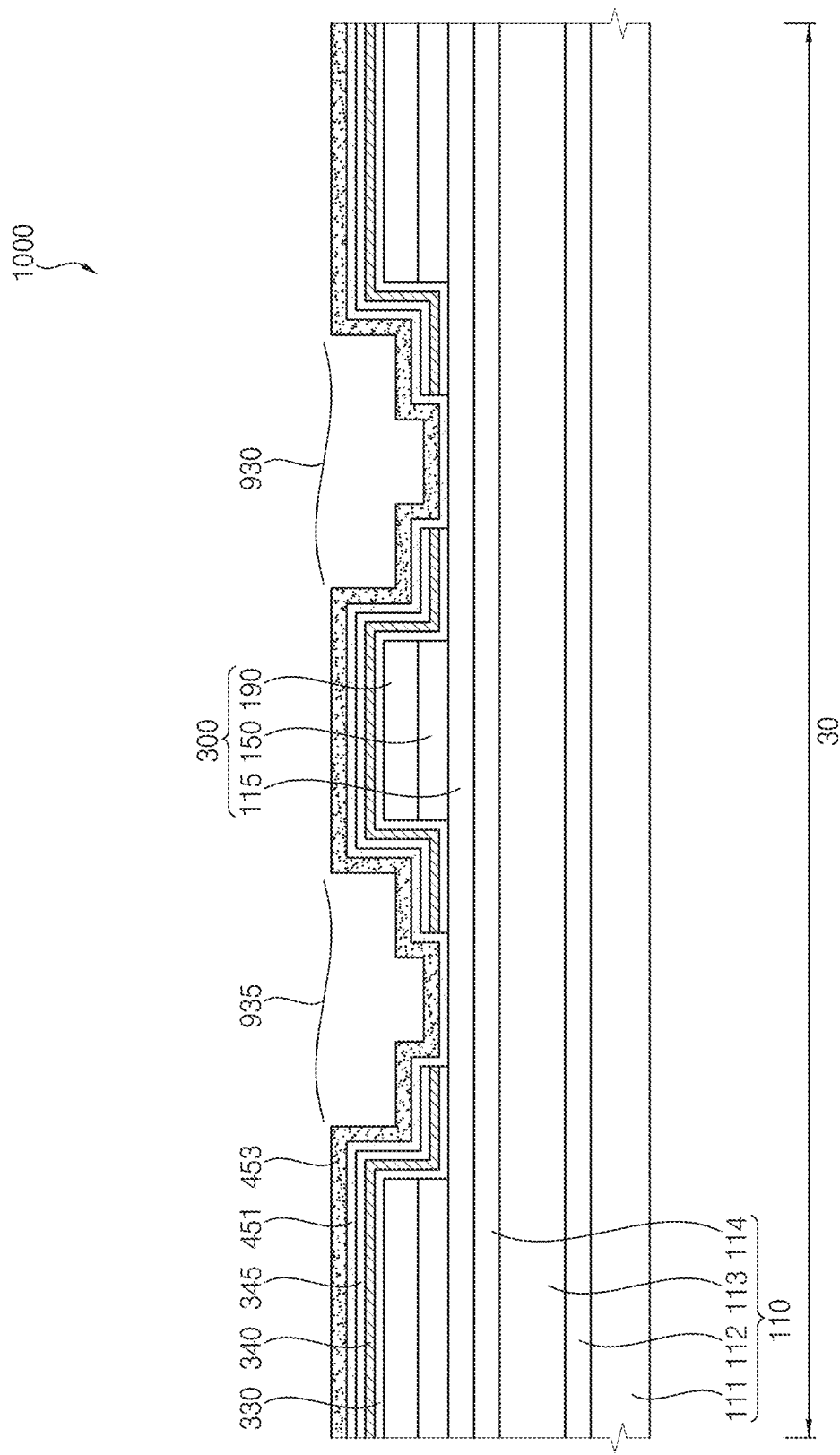
FIG. 23 is a cross-sectional view illustrating an OLED device in accordance with another alternative exemplary embodiment.

FIG. 23 is a cross-sectional view illustrating an OLED device in accordance with another alternative exemplary embodiment. An OLED device 1000 illustrated in FIG. 23 may have a configuration substantially the same as or similar to that of an OLED device 100 described with reference to FIGS. 1 through 6 except for a second groove 935. In FIG. 23, any repetitive detailed descriptions for elements that are substantially the same as or similar to elements described with reference to FIGS. 1 through 6 may be omitted.

Referring to FIGS. 1 through 6 and 23, an exemplary embodiment of an OLED device 1000 may include a substrate 110, an insulation layer structure 300, a semiconductor element 250, a planarization layer 270, a light emitting structure 200, a pixel defining layer 310, a capping layer 345, a TFE structure 450, an optical module 700, etc. In such an embodiment, the insulation layer structure 300 may include a buffer layer 115, a gate insulation layer 150 and insulating interlayer 190, and the light emitting structure 200 may include a lower electrode 290, a light emitting layer 330 and an upper electrode 340. In such an embodiment, the TFE structure 450 may include a first TFE layer 451, a second TFE layer 452 and a third TFE layer 453.

In an exemplary embodiment, the insulation layer structure 300 may further include a first groove 930 and a second groove 935, which are defined in the peripheral region 30, and each of the light emitting layer 330, the upper electrode 340 and the upper electrode 340 may be disconnected or separated inside each of the first groove 930 and the second groove 935. In such an embodiment, each of the light emitting layer 330, the upper electrode 340, and the upper electrode 340 may include an opening inside each of the first groove 930 and the second groove 935.

In the display region 10, the light emitting layer 330 may be disposed on the pixel defining layer 310 and the lower electrode 290. The light emitting layer 330 may extend in the first direction D1, and may be disposed in the peripheral region 30 on the insulating interlayer 190. In an exemplary embodiment, the light emitting layer 330 may be disposed inside each of the first groove 930 and the second groove 935, and a first opening that exposes a first portion of an upper surface of the buffer layer 115 located in the peripheral region 30 and a second opening that exposes a second portion of an upper surface of the buffer layer 115 located in the peripheral region 30 may be defined through the light emitting layer 330. In such an embodiment, the first opening of the light emitting layer 330 may be located inside of the first groove 930, and the second opening of the light emitting layer 330 may be located inside of the second groove 935. In such an embodiment, the light emitting layer 330 may be disconnected or separated in the peripheral region 30 by the first and second openings.

In the display region 10, the upper electrode 340 may be disposed to overlap the light emitting layer 330. The upper electrode 340 may extend in the first direction D1 on the light emitting layer 330, and may be disposed in the peripheral region 30. In an exemplary embodiment, the upper electrode 340 may be disposed inside each of the first groove 930 and the second groove 935, and a third opening that exposes the first portion of an upper surface of the buffer layer 115 located in the peripheral region 30 and a fourth opening that exposes the second portion of an upper surface of the buffer layer 115 located in the peripheral region 30 may be defined through the upper electrode 340. In such an embodiment, the third opening of the upper electrode 340 may be located inside of the first groove 930, and the fourth opening of the upper electrode 340 may be located inside of the second groove 935. In such an embodiment, the third opening of the upper electrode 340 may overlap the first opening of the light emitting layer 330, and the fourth opening of the upper electrode 340 may overlap the second opening of the light emitting layer 330. In such an embodiment, the upper electrode 340 may be disconnected or separated in the peripheral region 30 by the third and fourth openings.

In the display region 10, the capping layer 345 may be disposed to overlap the upper electrode 340. The capping layer 345 may extend in the first direction D1 on the upper electrode 340, may be disposed in the peripheral region 30. In an exemplary embodiment, the capping layer 345 may be disposed inside each of the first groove 930 and the second groove 935, and a fifth opening that exposes the first portion of an upper surface of the buffer layer 115 located in the peripheral region 30 and a sixth opening that exposes the second portion of an upper surface of the buffer layer 115 located in the peripheral region 30 may be defined through the capping layer 345. In such an embodiment, the fifth opening of the capping layer 345 may be located inside of the first groove 930, and the sixth opening of the capping layer 345 may be located inside of the second groove 935. In such an embodiment, the fifth opening of the capping layer 345 may overlap the first opening of the light emitting layer 330 and the third opening of the upper electrode 340, and the sixth opening of the capping layer 345 may overlap the second opening of the light emitting layer 330 and the fourth opening of the upper electrode 340. In such an embodiment, the capping layer 345 may be disconnected or separated in the peripheral region 30 by the fifth and sixth openings.

Figure 24:
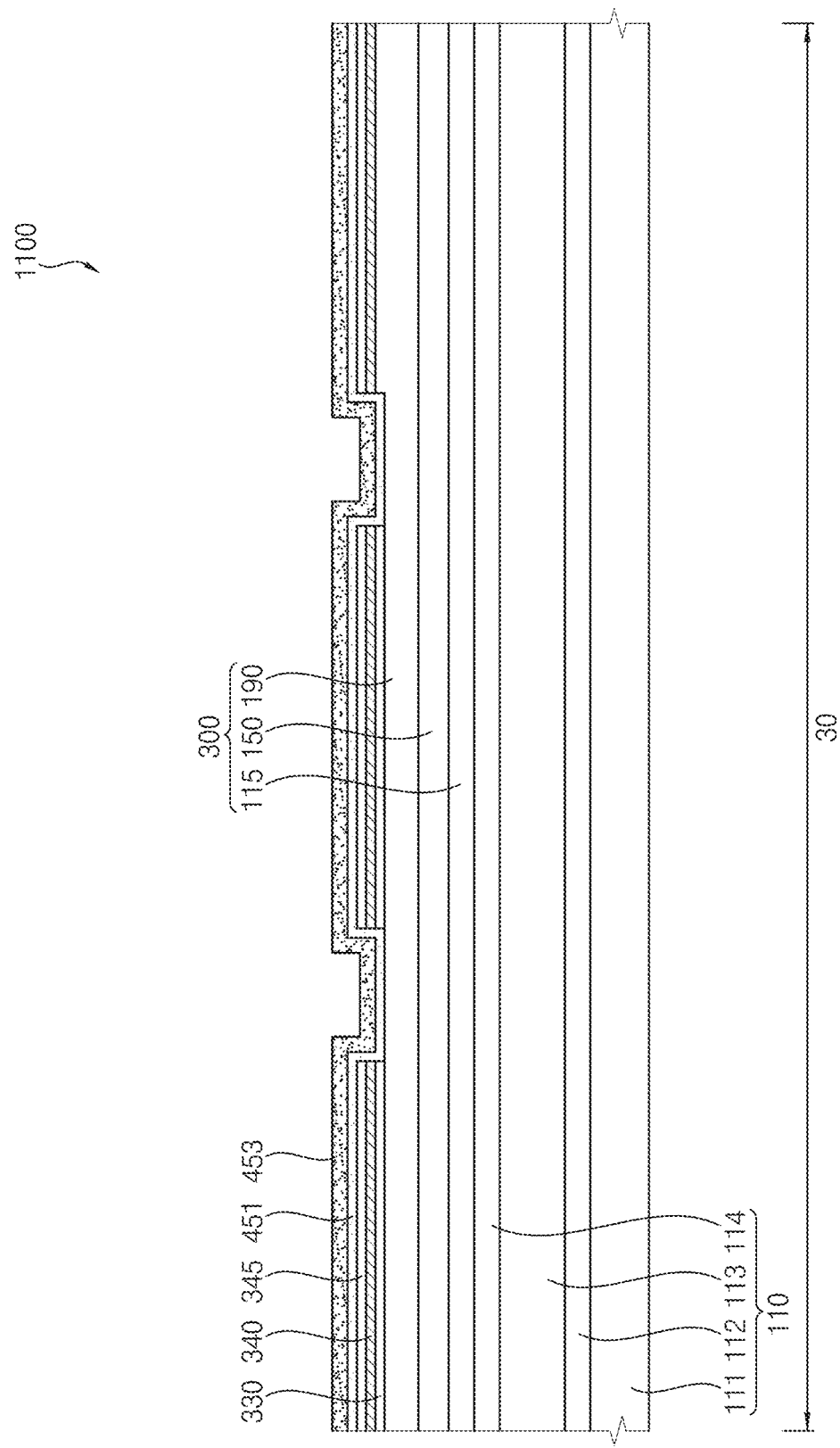
FIG. 24 is a cross-sectional view illustrating an OLED device in accordance with another alternative exemplary embodiment.

FIG. 24 is a cross-sectional view illustrating an OLED device in accordance with another alternative exemplary embodiment. An OLED device 1100 illustrated in FIG. 24 may have a configuration substantially the same as or similar to that of an OLED device 100 described with reference to FIGS. 1 through 6. In FIG. 24, any repetitive detailed descriptions for elements that are substantially the same as or similar to elements described with reference to FIGS. 1 through 6 may be omitted.

Referring to FIGS. 1 through 6 and 24, an exemplary embodiment of an OLED device 1100 may include a substrate 110, an insulation layer structure 300, a semiconductor element 250, a planarization layer 270, a light emitting structure 200, a pixel defining layer 310, a capping layer 345, a TFE structure 450, an optical module 700, etc. In such an embodiment, the insulation layer structure 300 may include a buffer layer 115, a gate insulation layer 150 and insulating interlayer 190, and the light emitting structure 200 may include a lower electrode 290, a light emitting layer 330 and an upper electrode 340. In such an embodiment, the TFE structure 450 may include a first TFE layer 451, a second TFE layer 452 and a third TFE layer 453.

The gate insulation layer 150 may be disposed on the active layer 130. The gate insulation layer 150 may cover the active layer 130 in the display region 10 on the buffer layer 115, and may extend in a first direction D1 from the display region 10 into the opening region 20 on the buffer layer 115. In an exemplary embodiment, the gate insulation layer 150 may be disposed in the display region 10 and the peripheral region 30 on the entire buffer layer 115.

The insulating interlayer 190 may be disposed on the gate electrode 170. The insulating interlayer 190 may cover the gate electrode 170 in the display region 10 on the gate insulation layer 150, and may extend in the first direction D1 on the gate insulation layer 150. In an exemplary embodiment, the insulating interlayer 190 may be disposed in the display region 10 and the peripheral region 30 on the entire gate insulation layer 150.

Accordingly, the insulation layer structure 300 including the buffer layer 115, the gate insulation layer 150 and the insulating interlayer 190 may be disposed on the substrate 110.

In the display region 10, the light emitting layer 330 may be disposed on the pixel defining layer 310 and the lower electrode 290. The light emitting layer 330 may extend in the first direction D1, and may be disposed in the peripheral region 30 on the insulating interlayer 190. In an exemplary embodiment, the light emitting layer 330 may be disposed on the insulation layer structure 300, and a first opening that exposes a first portion of an upper surface of the insulating interlayer 190 located in the peripheral region 30 and a second opening that exposes a second portion of an upper surface of the insulating interlayer 190 located in the peripheral region 30 may be defined through the light emitting layer 330. In such an embodiment, the first and second openings of the light emitting layer 330 may be located on the insulation layer structure 300. In such an embodiment, the light emitting layer 330 may be disconnected or separated in the peripheral region 30 on the insulation layer structure 300 by the first and second openings.

In the display region 10, the upper electrode 340 may be disposed to overlap the light emitting layer 330. The upper electrode 340 may extend in the first direction D1 on the light emitting layer 330, and may be disposed in the peripheral region 30. In an exemplary embodiment, the upper electrode 340 may be disposed on the light emitting layer 330, and a third opening that exposes the first portion of an upper surface of the insulating interlayer 190 located in the peripheral region 30 and a fourth opening that exposes the second portion of an upper surface of the insulating interlayer 190 located in the peripheral region 30 may be defined through the upper electrode 340. In such an embodiment, the third and fourth openings of the upper electrode 340 may be located on the insulation layer structure 300. In such an embodiment, the third opening of the upper electrode 340 may overlap the first opening of the light emitting layer 330, and the fourth opening of the upper electrode 340 may overlap the second opening of the light emitting layer 330. In such an embodiment, the upper electrode 340 may be disconnected or separated in the peripheral region 30 on the insulation layer structure 300 by the second and third openings.

In the display region 10, the capping layer 345 may be disposed to overlap the upper electrode 340. The capping layer 345 may extend in the first direction D1 on the upper electrode 340, may be disposed in the peripheral region 30. In an exemplary embodiment, the capping layer 345 may be disposed on the upper electrode 340, and a fifth opening that exposes the first portion of an upper surface of the insulating interlayer 190 located in the peripheral region 30 and a sixth opening that exposes the second portion of an upper surface of the insulating interlayer 190 located in the peripheral region 30 may be defined through the capping layer 345. In such an embodiment, the fifth and sixth openings of the capping layer 345 may be located on the insulation layer structure 300. In such an embodiment, the fifth opening of the capping layer 345 may overlap the first opening of the light emitting layer 330 and the third opening of the upper electrode 340, and the sixth opening of the capping layer 345 may overlap the second opening of the light emitting layer 330 and the fourth opening of the upper electrode 340. In such an embodiment, the capping layer 345 may be separated in the peripheral region 30 on the insulation layer structure 300 by the fifth and sixth openings.

Exemplary embodiments of the invention may be applied to various display devices including an OLED device, e.g., vehicle-display device, a ship-display device, an aircraft-display device, portable communication devices, display devices for display or for information transfer, a medical-display device, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to a specific exemplary embodiment disclosed, and that modifications to the disclosed exemplary embodiments, as well as other exemplary embodiments, are intended to be included within the scope of the appended claims.

What is claimed is:

1. A method of manufacturing an organic light emitting display device, the method comprising:
    preparing a substrate including an opening region, a peripheral region surrounding the opening region, and a display region surrounding the peripheral region;
    providing an insulation layer structure in the display region and the peripheral region on the substrate;
    forming a groove by removing at least a portion of the insulation layer structure located in the peripheral region;
    providing a light emitting layer inside the groove;
    contacting a first patterning member to a portion of the light emitting layer in the groove;
    forming a first opening of the light emitting layer by removing the portion of the light emitting layer in the groove after the first patterning member is disposed apart from the light emitting layer;
    providing a first thin film encapsulation layer in a way such that the first thin film encapsulation layer overlaps the first opening of the light emitting layer; and
    forming an opening in the opening region of the substrate.

2. The method of claim 1, further comprising:
    providing an upper electrode on the light emitting layer; and
    forming a second opening in the upper electrode in a way such that the second opening overlaps the first opening of the light emitting layer, after the forming the first opening of the light emitting layer.

3. The method of claim 2, further comprising:
    providing a capping layer on the upper electrode;
    contacting a second patterning member having a width less than a width of the first patterning member to a portion of the capping layer where the first and second openings are formed; and
    forming a third opening of the capping layer by removing the portion of the capping layer in the first and second openings after the second patterning member is disposed apart from the capping layer, after the forming the second opening in the upper electrode.

4. The method of claim 3, wherein
    the capping layer covers lateral surfaces of the light emitting layer, by which the first opening is defined, and lateral surfaces of the upper electrode, by which the second opening is defined, and
    the first thin film encapsulation layer is disposed in the third opening of the capping layer.

5. The method of claim 4, wherein a width of the third opening is less than a width of each of the first and second openings.

6. The method of claim 1, further comprising:
    providing an optical module in the opening, after the forming the opening in the opening region.

7. The method of claim 6, wherein the insulation layer structure includes:
    a buffer layer on the substrate;
    a gate insulation layer on the buffer layer, wherein an opening is defined through the gate insulation layer in the peripheral region; and
    an insulating interlayer on the gate insulation layer, wherein an opening is defined through the insulating interlayer in the peripheral region to overlap the opening of the gate insulation layer.

* * * * *